United States Patent
Tamura

Patent Number: 5,291,274
Date of Patent: Mar. 1, 1994

[54] ELECTRON DEVICE HAVING A CURRENT CHANNEL OF DIELECTRIC MATERIAL

[75] Inventor: Hirotaka Tamura, Atsugi, Japan

[73] Assignee: Fujitsu Limited, Kawasaki, Japan

[21] Appl. No.: 779,004

[22] PCT Filed: Mar. 20, 1991

[86] PCT No.: PCT/JP91/00372
§ 371 Date: Nov. 20, 1991
§ 102(e) Date: Nov. 20, 1991

[87] PCT Pub. No.: WO91/15033
PCT Pub. Date: Oct. 3, 1991

[30] Foreign Application Priority Data

| Mar. 20, 1990 | [JP] | Japan | 2-72354 |
| Mar. 20, 1990 | [JP] | Japan | 2-72355 |
| Mar. 20, 1990 | [JP] | Japan | 2-72356 |
| Jul. 20, 1990 | [JP] | Japan | 2-190722 |
| Oct. 25, 1990 | [JP] | Japan | 2-285862 |
| Nov. 9, 1990 | [JP] | Japan | 2-305572 |

[51] Int. Cl.$^5$ .................. H01L 29/06; H01L 39/22
[52] U.S. Cl. .................. 257/30; 257/35; 257/39; 257/565; 505/702
[58] Field of Search .......... 357/5, 6, 7, 10, 34, 357/54; 257/25, 30, 31, 32, 33, 35, 36, 37, 38, 39, 324, 325, 565, 640, 649, 650, 641; 505/1, 702

[56] References Cited

U.S. PATENT DOCUMENTS

| 3,972,059 | 7/1976 | DiStefano | 357/6 |
| 4,104,675 | 8/1978 | DiMaria et al. | 357/54 |
| 4,472,726 | 9/1984 | DiMaria et al. | 357/6 |
| 4,630,081 | 12/1986 | Calviello | 357/6 |
| 4,752,812 | 6/1988 | Arienzo et al. | 357/6 |
| 5,106,822 | 4/1992 | Tamura | 357/5 |

FOREIGN PATENT DOCUMENTS

| 20186346 | 12/1985 | European Pat. Off. | 257/30 |
| 0186346 | 7/1986 | European Pat. Off. | 357/6 |
| 63-269587 | 11/1988 | Japan | 357/6 |
| 63-289868 | 11/1988 | Japan | 357/23.15 |
| 2-262358 | 10/1990 | Japan | 357/23.15 |

Primary Examiner—Rolf Hille
Assistant Examiner—Steven Loke
Attorney, Agent, or Firm—Staas & Halsey

[57] ABSTRACT

An electron device comprises a first dielectric layer (103) having a first thickness determined to allow the tunneling of carriers therethrough and a first dielectric constant, a second dielectric layer (104) provided in contact with the first dielectric layer, the second dielectric layer having a second thickness substantially larger than the first thickness and a second dielectric constant that is substantially larger than the first dielectric constant, a first electrode (101) provided on the first dielectric layer for injecting the carriers, and a second electrode (108) provided in contact with the second dielectric layer for controlling a flow of the carriers through the second dielectric layer in response to a control voltage supplied thereto.

40 Claims, 36 Drawing Sheets

FIG. 7
PRIOR ART
FIG. 8
PRIOR ART
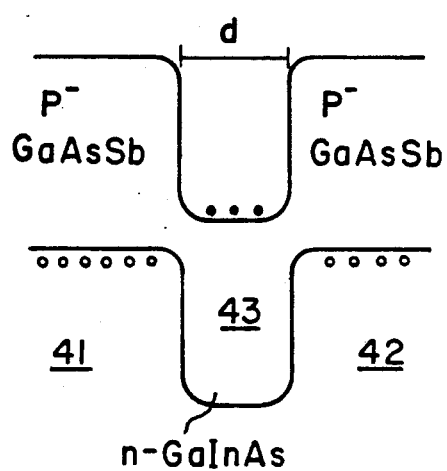
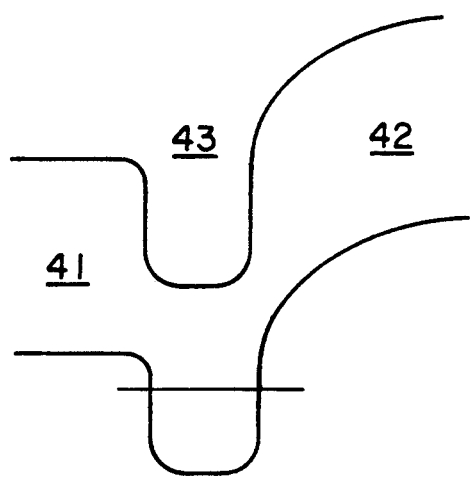

$$V = V_0 \exp\left(-\frac{x}{x_0}\right)$$

ELECTRON DEVICE HAVING A CURRENT CHANNEL OF DIELECTRIC MATERIAL

TECHNICAL FIELD

The present invention generally relates to electron devices, and in particular to an electron device having a dielectric channel layer for conducting carriers therethrough, wherein the flow of carriers is controlled in response to a control voltage applied to the dielectric layer.

In the field of information processing such as computers, transistors and diodes are the essential devices. Transistors carry out for various switching or amplification operations and are used for various logic circuits. Diodes, on the other hand, are used for various current rectifications and signal detections. Further, diodes showing the steeply changing resistance in response to the polarity of applied signals, are used for various switching devices of computers and other electronic apparatuses. Thus, the improvement of operational characteristics of the transistors directly influences the improvement of operation of the information processing system. Similarly, the development of diodes that can operate at low signal amplitude will contribute to the development of a telecommunication system or radar system that has an increased sensitivity.

BACKGROUND ART

Generally, transistors are formed from semiconductor materials such as silicon, germanium, or various compound semiconductor materials, and various transistors have been proposed so far.

FIGS. 1 through 12 show the examples of conventional transistors and diodes, wherein FIGS. 1 and 2 show the structure and the band structure of a typical bipolar transistor.

Referring to FIG. 1, the bipolar transistor includes an n-type emitter 11 surrounded by a p-type base 12, and a collector 13 surrounds the base 12 including the emitter 11. Under the collector 13, an n+-type buried collector region 14 is formed, and the collector current obtained at the collector 13 is lead to the surface of the structure via the buried collector region 14 and further through an n+-type contact region 15. Further, a substrate 16 of p-type silicon supports the foregoing vertical bipolar transistor structure. In correspondence to the emitter region 11, base region 12 and the collector contact region 15, an emitter electrode 17, a base electrode 18 and a collector electrode 19 are formed. As is commonly practiced, such bipolar transistor is formed by combining p-type and n-type silicon layers.

FIG. 2 shows the band structure of the bipolar transistor of FIG. 1. As can be seen therein, the n-type emitter region 11 has electrons, shown by solid circles in the drawing, in the conduction band as the carriers. On the other hand, the p-type base region 12 has holes, shown by open circles in the drawing, in the valence band thereof as the carriers. Further, the n-type collector region 13 has the electrons, also shown by the solid circles in the drawing, in the conduction band thereof as the carriers.

In operation, the base voltage at the base region 11 is controlled by the voltage that is applied to the base electrode 18. When a positive base voltage is applied, for example, the energy level of the base region 12 shifts in the downward direction. In response to such a downward shift of the base energy level, the potential barrier that has been formed by the conduction band of the base region 12 between the emitter region 11 and the collector region 13 substantially disappears. When this occurs, the electrons are injected from the emitter region 11 to the base region 12 and are transported through the base region 12 by the diffusion of the minority carriers. Thereby, the injected carriers reach the collector region 13 and a collector current flows through the transistor.

In such a bipolar transistor, the operational speed is mainly limited by the transit time of the carriers passing through the base region 12. Thus, in order to increase the operational speed of bipolar transistors, it is desired to form the base region by a semiconductor material having a high electron mobility. Alternately, the thickness of the base region 12 may be reduced for reducing the transit time of electrons through the base region. When the latter approach is employed, however, there arises a problem of increased lateral resistance of the base region. When this occurs, the voltage level within the base region is not controlled effectively and hence, the switching operation of the transistor. When the thickness of the base region 12 is reduced further, the depletion region accompanying the collector region is substantially overlapped with the depletion region that accompanies the emitter region. Such an overlapping of the depletion regions causes the so-called punch-through, wherein the flow of current through the base cannot be controlled anymore by the base voltage.

On the other hand, when the former approach is adopted, there is a limitation in the selection of suitable material, as the semiconductor materials other than silicon and germanium that can be doped to the p-type or n-type with controlled carrier concentration level, are relatively limited. Particularly, such conventional bipolar transistors cannot use the excellent electric properties of recently found high temperature superconductors.

FIGS. 3 and 4 show the structure of a conventional hot electron transistor and the band structure thereof.

Referring to FIG. 3, the device has an emitter region 21, a base region 23 and a collector region 25 each formed from a conductive material such as metal, and an emitter barrier region 22 and a collector barrier region 24 both of a wide gap semiconductor material are interposed between the emitter region 21 and the base region 23, and between the base region 23 and the collector region 25. The layered structure of the layers 21 through 24 is formed on a substrate 26, and the emitter region 21, the base region 23 and the collector region 25 have respective electrodes 17, 18 and 19.

In the hot electron transistor of such a construction, metals or doped semiconductors can be used for the emitter region, base region and the collector region, while insulating materials or semi-insulating materials can be used for the emitter barrier layer and the collector barrier layer. Further, such a structure does not require the exact control of the conductivity type for the emitter region, base region and the collector region.

As shown in the band diagram of FIG. 4, the emitter barrier region 22 and the collector barrier region 24 form the energy barrier against the passage of the carriers from the emitter region 21 to the collector region 25. With the increasing forward biasing across the base region 23 and emitter region 21, the barrier height of the emitter barrier 22 is decreased and the carriers in the emitter region start to cause tunneling through the region 22 to the base region 23. When there is a sufficiently large biasing across the collector region 25 and the emitter region 21, those electrons injected into the base region 23 and still maintaining the original energy pass through the base region 23 and reach the collector region 25. Thereby, a collector current flows in the transistor from the emitter region 21 to the collector region 25. The collector barrier 24 merely forms a potential barrier that separates the base region 23 from the collector region 25 electrically.

In such a hot electron transistor, however, there exists a problem in that, when the carriers injected to the base region 23 lose their energy by the scattering and the like, the carriers are confined between the barrier region 22 and the barrier region 24. Thus, the carriers thus trapped in the base region form a base current. In other words, the hot electron transistors tend to show an insufficient current gain.

FIG. 5 shows the band structure of a bipolar resonant tunneling transistor. The transistor basically has a structure of bipolar transistor and comprises an n-type GaAs emitter region 31, a p-type GaAs base region 32 and an n-type GaAs collector region 33. Between the emitter region 31 and the base region 32, there are formed a pair of resonant barrier region 34 of AlGaAs such that there is formed a two-dimensional quantum well between the two barrier regions 34. In operation, the barrier level of the base region 32 is changed in response to the base voltage, and the current flows from the emitter to the base upon the lowering of the barrier level of the base region 32.

In such a two-dimensional quantum well, a number of quantized states are formed with respective energy levels, and the incident carries that causes the resonance with the quantum level in the resonant barrier region 34 are selectively passed. Thus, the resonant tunneling transistor shows a strong non-linear characteristic that is not provided by other types of transistors.

In the band structure of FIG. 5, because of the lack of the collector barrier layer in contrast to the structure of FIG. 4, the problem of unsatisfactory common emitter current gain is eliminated. However, this structure still has the problem of transit time of carriers through the base similar to the transistor of FIG. 1 and the operational speed is limited. Further, the transistor requires a precise conductivity control for the collector, base and the emitter regions.

FIG. 6 shows the band structure of a resonant hot electron transistor. In contrast to the hot electron transistor of FIG. 3, the transistor of FIG. 6 has a resonant barrier region 36 for the base barrier region. Similar to the structure of FIG. 5, the resonant barrier region 36 comprises a pair of potential barriers that confine a two-dimensional quantum well therebetween. The resonant tunneling of the carriers occurs through the region 36 as a result of energetical resonance of the carriers with the quantum levels formed in the resonant barrier region 36. This transistor can use various metals and insulating materials and thus, the restriction about the materials that can be used for the transistor is relaxed. On the other hand, the transistor has the problem in that the common emitter current gain may be insufficient because of the trapping of the carriers in the base region 23.

FIG. 7 is a band diagram showing a tunnel transistor that has a structure of bipolar transistor. Referring to FIG. 7, the transistor comprises a p-type emitter region 41 and a p-type collector region 42 of GaAsSb wit an intervening base region 43 of n-type GaInAs. The thickness of the base region 43 is set small enough such that the carriers cause the tunneling from the emitter region 41 to the collector region 42 in response to a bias voltage applied to the base region 43. Typically, the thickness d of the base region 43 is set to about 50 Å.

GaAsSb forming the emitter region 41 and the collector region 42 has a composition of $GaAs_{0.5}Sb_{0.5}$ with the carrier concentration level of $10^{16}$ cm$^{-3}$ or less. On the other hand, the base region 43 has a high impurity concentration level and thus a high conductivity. Thereby, the potential barrier formed in correspondence to the base region 43 can be controlled in response to the base voltage applied to the base electrode. As the thickness of the base region 43 is thin, the reduced thickness of the barrier height causes immediately the tunneling of the holes from the emitter region 41 to the collector region 42, passing through the base region 43. The transit of the holes through the base region 43 by the tunneling is controlled by the base voltage and thus, the current flowing between the emitter and collector of the transistor is controlled by the base voltage. The time necessary for the holes to transit through the base region 43 is much smaller than the life time of the holes in the base region because of the reduced thickness of the base. Thus, the common base current gain of approximately 100% can be achieved by this conventional transistor.

This transistor, however, has a problem, associated with the extreme thickness of the base region 43, in that the base region 43 has an appreciable lateral resistance. When the base resistance is large, the time needed for controlling the potential barrier of the base region is increased because of the increased time constant formed as a result of the resistance and parasitic capacitance of the base region. Thus, the transistor generally fails to provide the high speed characteristics that is expected. The doping to reduce the lateral resistance of the base 43 is not successful, as such a doping causes an increased scattering of the holes in the base region and thus the reduced current gain. Further, this transistor also has the problem of limitation in the material that can be used for forming the active part thereof. For example, the high temperature superconductors that has been developed in the past several years cannot be employed.

Further, there is proposed a low temperature tunneling transistor as disclosed in the Japanese Laid-open Patent Application 60-142580, wherein the carrier transit time across a pair of adjacent electrodes is minimized by flowing the carriers in the form of tunneling current.

FIG. 9 shows the principle of this prior art transistor, wherein a GaAs channel layer 52 is provided on an insulating substrate 51, and source, gate and drain electrodes 53, 55 and 54 are provided on the channel layer 52. The channel layer 52 is formed to act as an insulator having the energy barrier of 2–3 meV in the low temperature region and this barrier is controlled in response to the gate voltage applied to the gate 55. FIG. 10 shows an improvement of the device of FIG. 9 wherein an insulating film 57 is interposed between the channel 52 and the gate electrode 55 for securing the channel-gate isolation.

This transistor of FIG. 9 and FIG. 10 has a serious problem, arising from the basic principle of the transistor, in that it has to satisfy two, mutually inconsistent requirements as follows. In the first requirement, to avoid the diversion of the tunneling current to the gate electrode and to maximize the current gain, it is necessary to separate the gate electrode 55 from the channel layer 52 as much as possible. In the second requirement, the gate electrode 55 has to be provided as close as possible to the channel layer 52 in order to achieve an efficient control of the barrier height in the channel layer 52 by the control voltage applied to the gate electrode 55. The separation between the gate electrode 55 and the channel layer 52 has to be set such that a tunnel current flows between the source 55 and the drain 54, and associated therewith, the gate 55 has to be provided closer to the channel layer 52 than the distance between the source electrode 53 and the drain electrode 54. However, such an arrangement inevitably causes the tunneling current flowing also through the gate electrode 55. The insulator film 57 of FIG. 10 is provided to avoid this problem. However, such an insulator film 57 decreases the potential coupling between the barrier in the channel layer 52 and the gate voltage. This problem may seem to be solved by setting a large distance between the source and drain electrodes and reducing the barrier height between the source and drain electrodes. However, the barrier height between the source and drain electrodes is determined by the contact potential between the source electrode 53 and the channel layer 52, and the contact potential between the channel layer 52 and the drain electrode 54. Thus it is generally not possible to realize the barrier height of 2–3 meV as is needed for this purpose.

FIG. 11 shows a typical conventional diode. Referring to FIG. 11, the diode comprises a cathode region 61 of n-type single crystal silicon and an anode region 62 of a p-type single crystal silicon contacted with each other to form a p-n junction. FIG. 12 shows the band structure of the diode of FIG. 11, wherein $E_F$ represents the Fermi level in the thermal equilibrium state, $E_C$ represents the bottom of the conduction band in the thermal equilibrium state, and $E_V$ represents the top of the valence band in the thermal equilibrium state. $\Phi$ represents the barrier height formed in the conduction band in the thermal equilibrium state.

In operation, a forward bias voltage is applied across the anode region 62 and the cathode region 61. In response to this, the Fermi level changes from $E_F$ to $E_F'$, the conduction band from $E_C$ to $E_C'$, and the valence band from $E_V$ to $E_V'$.

In response to the application of the forward bias voltage, electrons are injected from the cathode region 61 to the anode region 62 as the minority carriers while holes are injected from the anode region 62 to the cathode region 61 as the minority carriers. Thereby a current flows across the diode. On the other hand, when the diode is reversely biased, the depletion region is formed at the p-n junction interface and the carriers do not flow across the p-n junction Thus, the diode shows the rectification operation.

The foregoing rectification is obtained by the existence of the barrier of which height $\Phi$ is determined by the band gap of the semiconductor material used for the cathode and anode. It should be noted that the barrier height $\Phi$ is decreased, when a forward biasing is applied, such that the current density in the diode is represented as $$J = AT^2 \cdot exp(-\Phi_o/kT)(exp(eV/kT)-1),$$

where A stands for the Richardson's constant T represents the absolute temperature, $\Phi_o$ represents the barrier height at the no bias voltage, k stands for the Boltzmann's constant, and V represents the forward bias voltage.

From this equation, it can be seen that the term eV has to have a value close to $\Phi_o$ in order that a sufficient forward current is obtained. In other words, there exists a forward threshold voltage in such a diode for causing to flow currents under the forward biasing state. This threshold voltage changes depending on the material and takes a value of about 0.6 volts in silicon and 0.2 volts in germanium. Thus, the conventional diode has required to have the input signal amplitude of at least 0.6 volts in the commonly used silicon diode. However, such a limitation excludes the possibility of rectifying signals such as the electromagnetic signals traveled over a long distance path or feeble radar echo signals from a distant target. It should be noted that such signals may have the signal amplitude of only 20 mV–30 mV in the maximum. In the case of the Josephson integrated circuits, a similar problem occurs. As the output logic amplitude of the Josephson processors is typically in the order Of 3 mV, the conventional diodes cannot process the output signal of the Josephson processors. As a matter of fact, there is no known diode that can rectify the output logic signal of Josephson processors directly.

DISCLOSURE OF THE INVENTION

Accordingly, it is a general object of the present invention to provide a novel and useful electron device wherein the foregoing problems are eliminated.

Another and more specific object of the present invention is to provide an electron device wherein the control of current flowing through the electron device is achieved by a control voltage that is applied to a dielectric barrier layer.

Another object of the present invention is to provide a transistor having an emitter, a base and a collector stacked with each other to form a path of the carriers from the emitter to the collector via the base, wherein the base comprises a dielectric material and passage of the current from the emitter to the base is controlled by a control voltage applied to the dielectric base. According to the present invention, the leak of the current, flowing from the emitter to the control electrode, through the dielectric base is substantially eliminated and a large amplification factor can be achieved.

Another object of the present invention is to provide a tunnel transistor having an emitter, base and a collector stacked with each other to form a path of carriers flowing from the emitter to the collector via the base, wherein the base is formed from a first dielectric layer, a second dielectric layer and a third dielectric layer, and wherein the second thick dielectric layer has a large dielectric constant larger than the other two dielectric layers and the first dielectric layer has a thickness that allows passage of carriers by tunneling. The flow of the carriers from the emitter to the collector is controlled by the control voltage applied to the second dielectric layer, whereby the voltage level in the dielectric base and hence the energy barrier at the base is controlled in response to the control voltage.

Another object of the present invention is to provide a planar tunnel transistor having an emitter, a base and a collector arranged into a planar construction, wherein the emitter and the collector are formed on the base formed from a dielectric material, with a minute separation therebetween. According to the present invention, the separation between the emitter and the collector can be reduced sufficiently to flow the tunneling current via the dielectric base while without flowing the tunnel current through the base into a controlling electrode provided thereon.

Another object of the present invention is to provide a planar tunnel transistor comprising a dielectric base layer provided with an emitter and a collector separated from each other with a distance to allow a tunnel current to flow through the base, the dielectric base layer having a resonant structure that causes a resonant tunneling of carriers, and a control electrode is provided on the dielectric base layer for modifying the barrier level thereof. According to the present invention, the low barrier height of the dielectric base layer for tunneling of carriers is no longer required. Thereby, one can use a high barrier height material for the base layer and the need of low temperature environment hitherto necessary for the tunnel transistors for eliminating thermal noise, is no longer necessary. Thus, one can use the transistor in a wide operational environment.

Another object of the present invention is to provide a diode comprising a layered structure of a cathode electrode and an anode electrode, with an intervening dielectric layered structure comprising a first dielectric layer and a second dielectric layer, wherein the first dielectric layer has a thickness that allows tunneling of carriers therethrough while the second dielectric layer has a substantially larger thickness, and wherein the second dielectric layer has a dielectric constant that is substantially larger than the dielectric constant of the first dielectric layer. According to the present invention, the effective barrier height of the diode that is formed by the second dielectric layer becomes significantly smaller than the barrier height of the conventional diodes because of the large dielectric constant of the second dielectric layer. Thereby, the diode of the present invention can provide the rectification of extremely feeble signals of which amplitude may be several millivolts or less.

Other objects and further features of the present invention will become apparent from the following detailed description when read in conjunction with the attached drawings.

BRIEF DESCRIPTION OF THE DRAWINGS

FIG. 7 is a band diagram showing the band structure of a conventional tunnel transistor;

FIG. 8 is a band diagram corresponding to FIG. 7 showing the operational state of the tunnel transistor;

FIG. 78 is a diagram showing the formation of the depletion region at the metal-semiconductor interface in the conventional diode;

BEST MODE FOR CARRYING OUT THE INVENTION

Figure 1:
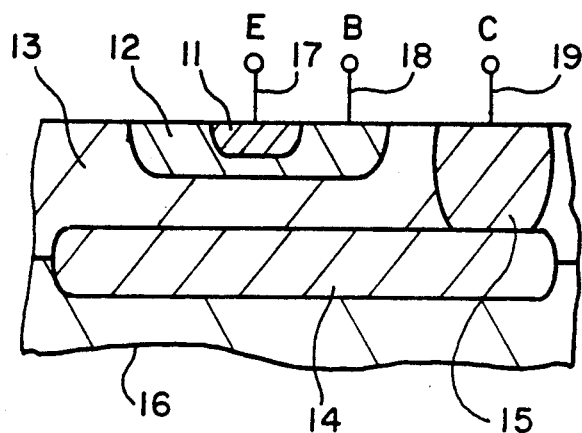
FIG. 1 is a diagram showing the structure of a typical conventional bipolar transistor.
Figure 2:
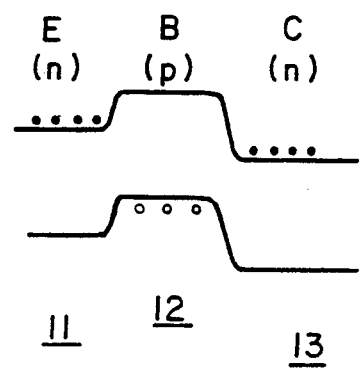
FIG. 2 is a band diagram showing the band structure of the transistor of FIG. 1.
Figure 3:
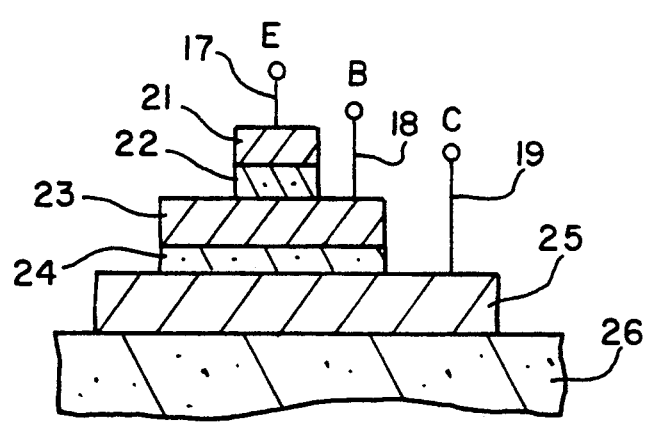
FIG. 3 is a diagram showing the structure of a conventional hot electron transistor.
Figure 4:
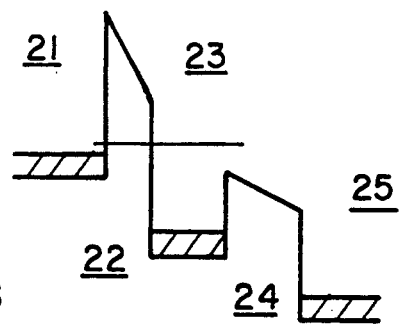
FIG. 4 is a band diagram showing the band structure of the transistor of FIG. 3.
Figure 5:
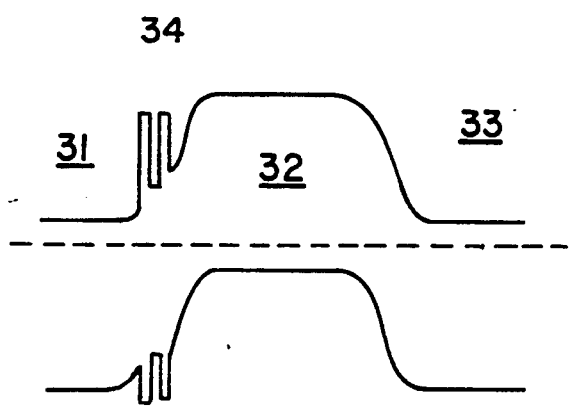
FIG. 5 is a band diagram showing the band structure of a conventional resonant tunneling transistor.
Figure 6:
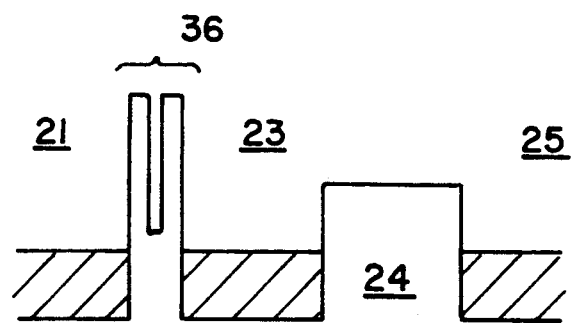
FIG. 6 is a band diagram showing the band structure of a conventional resonant hot electron transistor.
Figure 9:
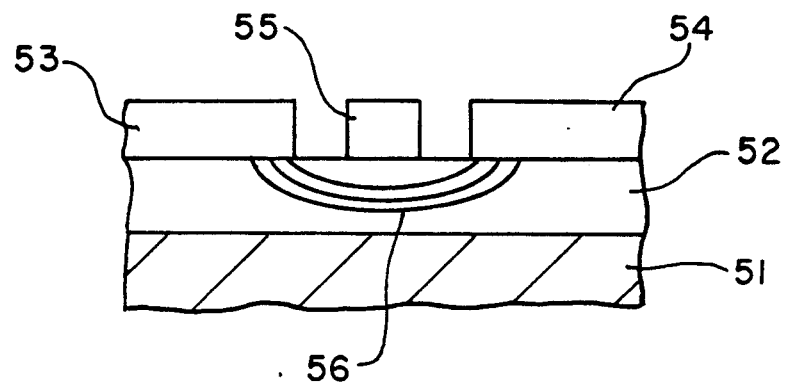
FIG. 9 is a diagram showing the structure of a conventional planar tunnel transistor.
Figure 10:
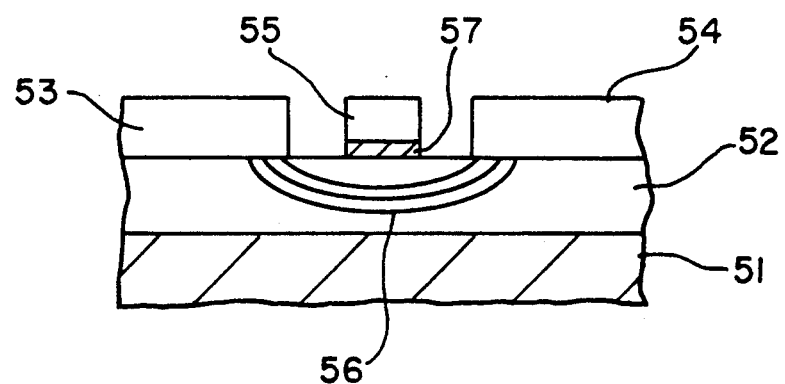
FIG. 10 is a diagram showing the structure of another improved conventional planar tunnel transistor.
Figure 11:
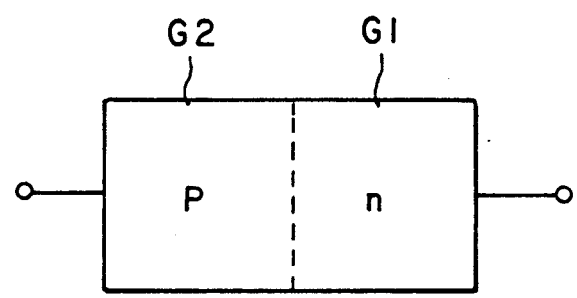
FIG. 11 is a diagram showing the structure of a typical diode.
Figure 12:
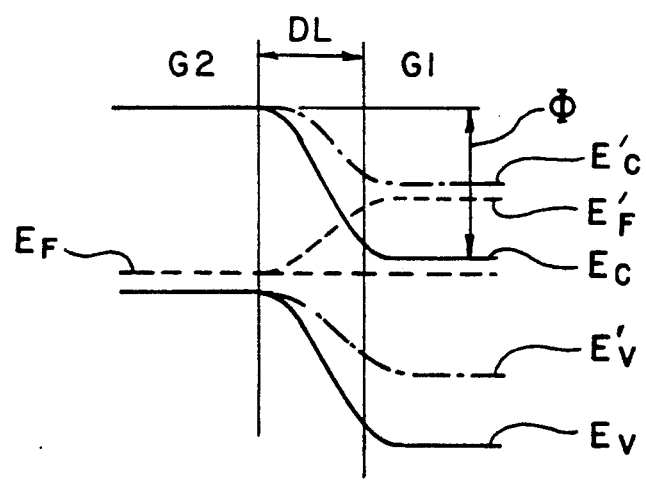
FIG. 12 is a band diagram showing the operation of the diode of FIG. 11.
Figure 13:
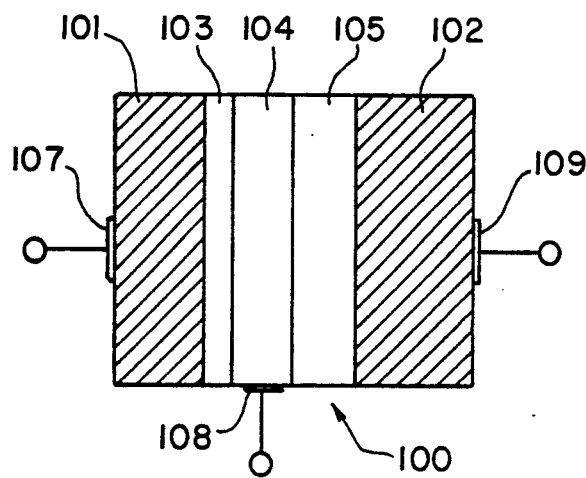
FIG. 13 is a diagram showing the structure of a transistor according to a first embodiment of the present invention.

Next, the principle of the present invention will be described with reference to FIG. 13 showing a tunnel transistor that forms a first embodiment of the present invention.

Referring to FIG. 13, the transistor has the most basic structure and comprises a conductive emitter region 101 and a conductive collector region 102, with an intervening layered dielectric structure 100. The emitter region 101 and the collector region 102 may be formed from a doped semiconductor material or a metal. When a semiconductor material is used for the emitter and collector regions 101 and 102, any of the p-type and n-type semiconductor materials may be used as long as it has a sufficiently high conductivity.

The dielectric structure 100 comprises a first dielectric layer 103, a second dielectric layer 104 and a third dielectric layer 105 stacked consecutively, wherein the dielectric layer 103 is provided adjacent to the emitter region 101 and the dielectric layer 105 is provided adjacent to the collector region 105. The layer 104 is located between the layer 103 and 105. Further, an emitter electrode 107 is provided on the emitter region 101, a collector electrode 109 is provided on the collector region 102, and a control electrode 108 is provided the second dielectric layer 104.

Figure 14:
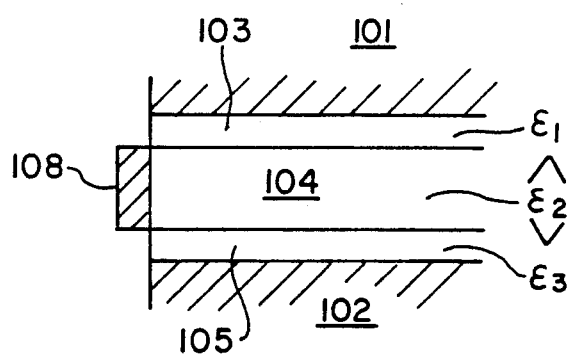
FIG. 14 is a diagram showing the dielectric layer forming the essential part of the transistor of FIG. 13.

FIG. 14 shows the dielectric layered structure 100 in detail.

Referring to FIG. 14, the dielectric layer 103 that makes a contact with the emitter region 101 has a dielectric constant $\epsilon_1$, the dielectric layer 105 that makes a contact with the collector region 102 has a dielectric constant $\epsilon_3$, and the dielectric layer 104 intervening between the layers 103 and 105 has a dielectric constant $\epsilon_2$, wherein the dielectric constant $\epsilon_2$ is much larger than the dielectric constants $\epsilon_1$ or $\epsilon_3$ ($\epsilon_2 \gg \epsilon_1, \epsilon_3$).

Figure 15:
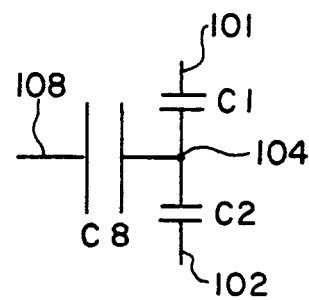
FIG. 15 is a diagram showing the equivalent circuit of the dielectric layer of FIG. 14.

FIG. 15 shows the equivalent circuit of the dielectric structure 100. As can be seen from this circuit diagram, the potential within the base region 104 is determined by the electrostatic induction caused via a capacitance C8 formed between the control electrode 108 and the dielectric layer 104, a capacitance C1 formed between the emitter region 101 and dielectric layers 103, 104, and a capacitance C2 formed between the collector region 102 and the dielectric layers 104, 105. It should be noted that the capacitance C8 has the largest capacitance value because of the largest dielectric constant $\epsilon_2$. Thus, the voltage level in the dielectric structure 100 is mainly determined by the control voltage applied to the control electrode 108.

Figure 16:
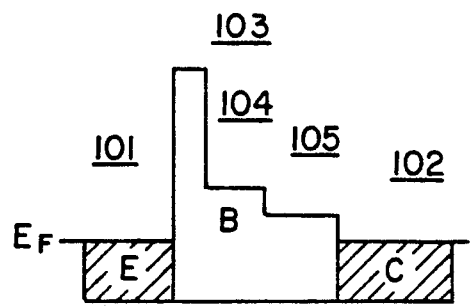
FIG. 16 is a diagram showing the band structure of the transistor of FIG. 13 in the unbiased state.

FIG. 16 shows the band structure of the transistor of FIG. 13 in the unbiased state, wherein the bottom of the conduction band of each part of the transistor of FIG. 13 is illustrated. Thus, this diagram shows the case where the carriers are formed from electrons.

As can be seen in this drawing, the first dielectric layer 103 is formed from a material having a large band gap and forms the highest potential barrier. On the other hand, this potential barrier, though having the largest barrier height, does not block the passage of the carriers through the layer 102 effectively when used alone, because of the reduced thickness that allows the tunneling of carriers. The second dielectric layer 104 and the third dielectric layer 105 also form potential barriers through with reduced height, wherein the barrier height of the layer 104 is higher than the barrier height of the layer 105.

In the unbiased state, the Fermi level of the emitter region 101 is at the same level as the Fermi level of the collector region 102 while each layer 103, 104 and 105 form the potential barrier that is higher than the Fermi level Thus, the layered dielectric structure 100 works, as a whole, as an effective potential barrier and the flow of carries from the emitter region 101 to the collector region 102 is effectively prevented.

Figure 17:
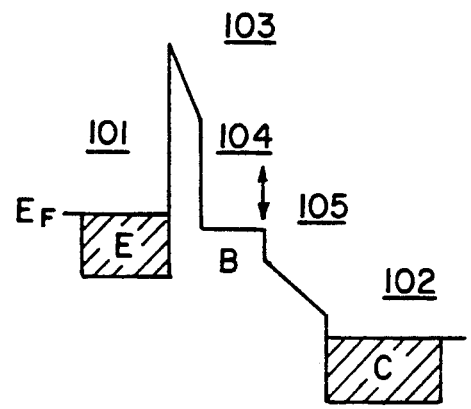
FIG. 17 is a diagram corresponding to FIG. 16 showing the band structure in the biased state.

FIG. 17 shows the band diagram of the transistor in the biased state wherein a forward bias voltage is applied across the emitter region 101 and the collector region 102. As a result of the forward biasing, there appears a slope in the conduction band in correspondence to the dielectric layers 103 and 105 because of the small dielectric constant $\epsilon_1$, $\epsilon_3$. On the other hand, the conduction band of the dielectric layer 104 remains substantially flat because of the large dielectric constant $\epsilon_2$. This means that the gradient of the potential in the layer 104 causing the electric field is neutralized by the polarization occurring in the layer 104. In the state of FIG. 17, the level of the conduction band of the layer 104 can be shifted up and down in response to the control voltage applied to the terminal 108. Thus, when the conduction band of the layer 104 is controlled at the level above the Fermi level of the emitter region 101, the dielectric layer 104 blocks the flow of carriers from the emitter region 101 to the collector region 102 even when there is a forward biasing. On the other hand, when the conduction band of the layer 104 is lowered to the level below the Fermi level of the emitter region 101, the electrons flow from the emitter region 101 to the conduction band of the dielectric layer 104 by tunneling through the dielectric layer 103. Once passed through the layer 103, the electrons reach the collector region 102 along the conduction band of the layers 104 and 105. During the transport along the conduction band of the layer 105, the electrons are accelerated by the electric field.

A similar operation is obtained also when the holes are used for the carriers. It should be noted that, when the holes are used for the carriers, the p-type semiconductors are used for the emitter and collector regions 101 and 102. Thereby, one can read the band diagram of FIGS. 16 and 17 upside-down with the replacement of the illustrated conduction band by the valence band.

It should be noted that the transistor of the present invention is controlled by the electrostatic induction of the potential level in the layered dielectric structure 100. Thus, the structure 100 does not conduct currents to the control electrode 108. Thus, the unwanted diversion of the collector current in the form of base current as in the case of the conventional bipolar transistor does not occur in the present transistor.

Figure 18:
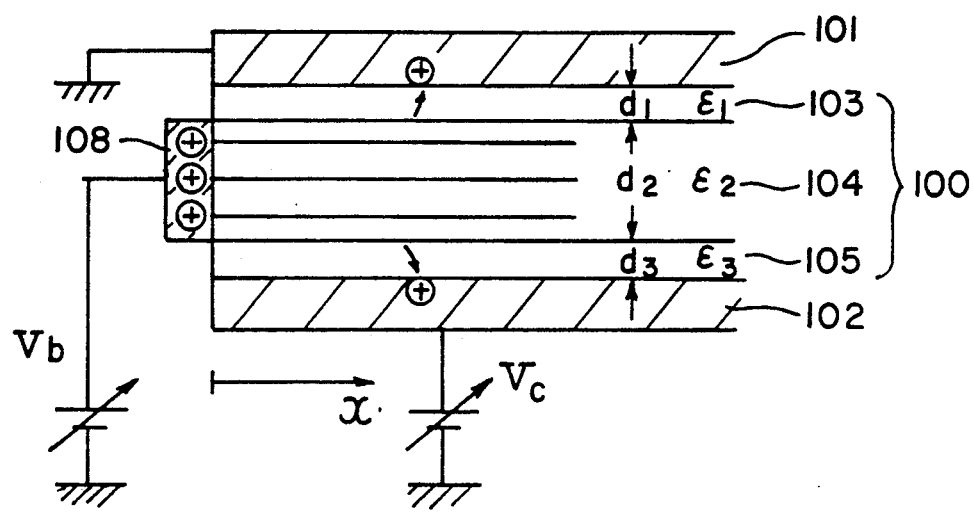
FIG. 18 is a diagram showing the operation of the transistor of FIG. 13.
Figure 19:
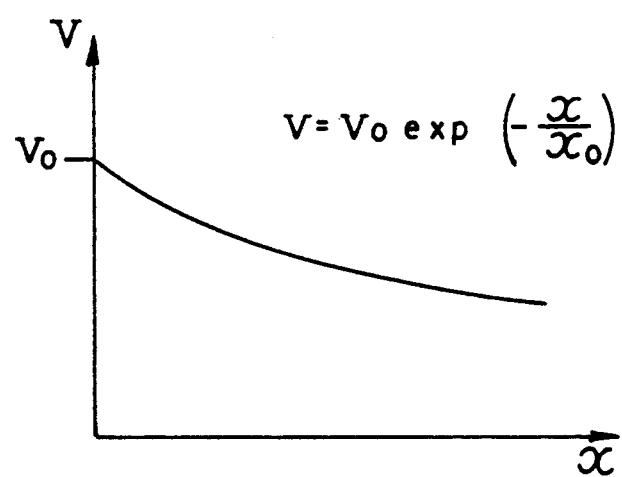
FIG. 19 is a graph showing the potential distribution in the dielectric layer used in the transistor of FIG. 13.

FIGS. 18 and 19 show a more detailed analysis of operation of the transistor of FIG. 13. As can be seen, the first dielectric layer 103, the second dielectric layer 104 and the third dielectric layer 105 have respective thicknesses $d_1$, $d_2$ and $d_3$. In the case of operating the transistor by flowing electrons from the emitter region 101 to the collector region 102, the emitter region 101 is grounded and the collector region 102 is applied with a positive collector voltage. Further, a positive voltage is applied to the electrode 108 as the control voltage.

As the dielectric constant $\epsilon_2$ of the second dielectric layer 104 is substantially larger than the dielectric constant $\epsilon_1$ or $\epsilon_3$ of the layer 103 or 105, the electric flux formed in the layer 104 tends to be confined in the layer 104. Thereby the flux penetrates deeply into the interior of the layer 104 in the x-direction as shown in FIG. 18 by the arrows. In other words, the voltage level or potential at the control electrode 108 reaches deeply inside the dielectric layer 104.

Next, the analysis about the penetration of the potential into the interior of the dielectric layer 104 in the structure of FIG. 18 will be described.

Starting from the Maxwell's equation, the spatial distribution of the electric displacement D is represented as $$D = \epsilon E$$

$$div D = \rho$$

where E represents the electric filed vector and $\rho$ represents the electric charge density distribution in the dielectric structure 100 of FIG. 18.

The above equations are expanded as follows for the structure of FIG. 18 as $$dD/dx = V \cdot (\epsilon_1 d_3 + d_1 \epsilon_3) d_1 d_2 d_3 + V_d \epsilon_3 / d_2 d_3$$

$$dV/dx = -D/\epsilon_2 \cdot d_2.$$

From these equations, one obtains the representation of the potential or voltage distribution V in the dielectric layer 104 as a function of the distance x from the control electrode 108 as $$V = V_0 + (V_b - V_0) exp(-x/x_0)$$

where $$V_0 = V_c \cdot d_1/\epsilon_1/(d_1/\epsilon_1 + d_2/\epsilon_3)$$

$$x_0 = [d_1 d_2 d_3 \epsilon_2/(d_3 \epsilon_1 + d_1 \epsilon_1)]^{\frac{1}{2}}.$$

The parameters $V_b$ and $v_c$ are defined in FIG. 18.

It should be noted that the parameter $x_0$ represents the characteristic length of penetration of the potential into the dielectric layer 104. For example, in the system where $d_1 = d_3 = 10$ nm, $d_2 = 500$ nm, $\epsilon_1 = \epsilon_3 = 8$ and $\epsilon_2 = 20,000$ the length $x_0$ assumes the value of 2.5 $\mu$m.

Thus, it is shown that the potential inside the dielectric layer 104 is controlled by the voltage applied to the electrode 108. FIG. 19 shows the distribution of the voltage inside the dielectric layer 104. Thereby, the control of passage of electrons from the emitter region 101 to the collector region 102 via the dielectric structure 100 is achieved as described with reference to FIGS. 16 and 17.

Figure 20:
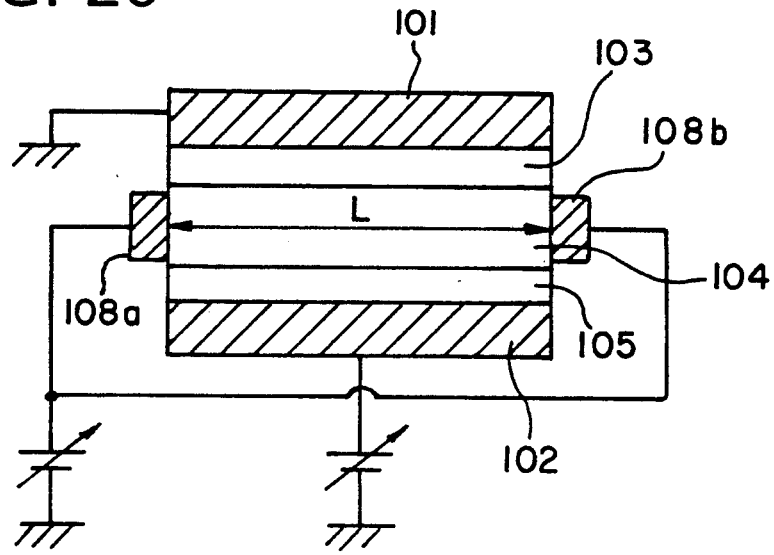
FIG. 20 is a diagram showing a modification of the transistor of FIG. 13.
Figure 21:
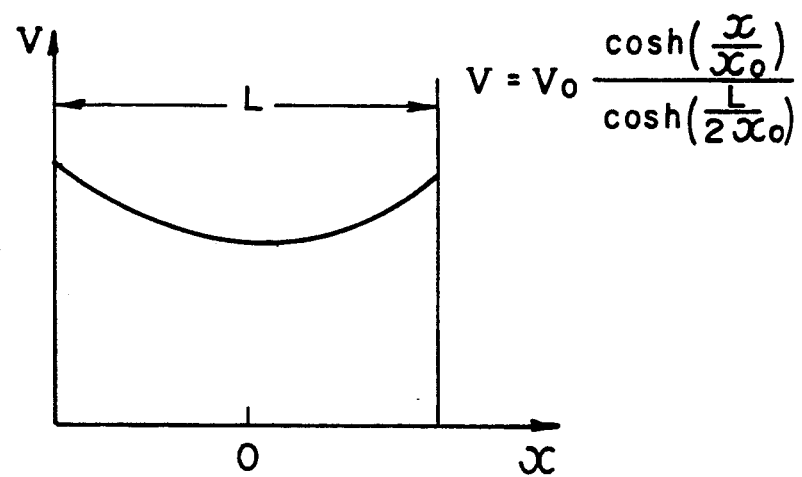
FIG. 21 is a graph showing the potential distribution in the dielectric layer in the device of FIG. 20.

FIG. 20 shows a modification of the embodiment of FIG. 13, wherein the control electrode is provided at both sides of the dielectric layer 104 as electrodes 108a and 108b. In correspondence to this, the voltage in the dielectric layer 104 is given as $$V = V_0 + (V_b - V_0) \cdot \cosh(x/x_0)/\cosh(L/2x_0)$$

where L represents the distance between the electrode 108a and the electrode 108b. The distribution defined by the above equation is given in FIG. 21.

Again, it can be seen, from these equations, that the voltage in the layer 104 is controlled by the control voltage applied to the electrodes 108a and 108b. No control current is necessary.

Next, a second embodiment of the present invention will be described with reference to FIG. 22.

Figure 22:
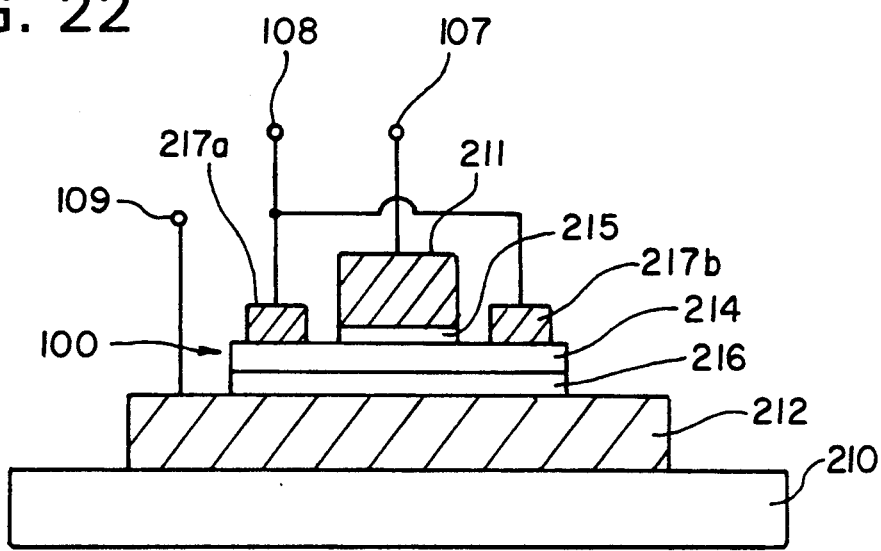
FIG. 22 is a diagram showing the structure of a transistor according to a second embodiment of the present invention.

Referring to FIG. 22, the electron device is a transistor having a collector layer 212 of gold sputter-deposited on an insulating substrate 210 such as silicon oxide or sapphire with a thickness of a about 5000 Å. On the collector layer 212, a zinc oxide (ZnO) layer 216 is grown by sputtering as the third dielectric layer corresponding to the layer 105 of FIG. 13, with a thickness of about 2000 Å. Further, a strontium titanate (SrTiO$_3$) layer 214 is grown by sputtering on the zinc oxide layer 123 with a thickness of about 500 Å as the second dielectric layer corresponding to the layer 104, and a silicon oxide (SiO$_2$) layer 215 is grown on the layer 214 by sputtering as the first dielectric layer corresponding to the layer 103, with a thickness of about 50 Å. Thereby, the layers 214–216 form the layered dielectric structure 100. Finally, on the first dielectric layer 215, an emitter layer 211 of gold is sputter-deposited with a thickness of 5000 Å.

It should be noted that silicon oxide has a large energy gap of about 8 meV and forms the large potential barrier shown in FIG. 16. On the other hand, this material has the small specific dielectric constant of about 8. In contrast, strontium titanate forming the layer 214 has the specific dielectric constant of 200–300 in the room temperature. In the low temperature environment such as 77° K, the specific dielectric constant increases to 2000–3000. Further, in the extremely low temperature environment such as 10°K, the specific dielectric constant of SrTiO$_3$ increases to about 20,000. The band gap of strontium titanate is small as compared with silicon oxide and takes a value of about 3.3 meV. ZnO is a dielectric material having a narrow band gap of about 3 eV and the specific dielectric constant of about 10.

In the structure of FIG. 22, the collector layer 212 extends laterally beyond the layered dielectric structure 100 and a lead is connected to the exposed top surface of the collector layer 212 as the collector electrode 109. Further, the silicon oxide layer 211 has a smaller lateral size than the underlying second dielectric layer 214 and the layer 214 forms an exposed part in the top surface thereof. On this exposed part, control electrodes 217a and 217b of gold are deposited at both side of the layer 215 with a thickness of about 5000 Å, and leads are connected to form the control electrode 108. The lateral size of the dielectric layer 215 is set sufficiently small such that the separation between the two control electrodes 217a and 217b is smaller than 2 μm. Further, a lead is connected to the top surface of the emitter layer 211 as the emitter electrode 107. Thus, by applying a forward biasing across the emitter and collector electrodes as shown in FIG. 20, the emitter current is controlled in response to the control voltage applied to the control electrode 108.

In the structure of FIG. 22, it should be noted that the emitter and collector layers 211 and 212 need not to be the semiconductor materials. In fact, the material used for these parts in the foregoing example is gold, a low resistance metal. In view of increasing the operational speed of the transistor further, it is advantageous to use superconductors for the emitters and collectors such that the resistance of these parts is decreased further.

For example, one may use the high temperature superconductors such as YBa$_2$Cu$_3$O$_7$ for the emitter layer 211 and the collector layer 212. When using such an oxide-base superconductors, it is necessary to choose the material for the regions that contact with these electrodes. For example, MgO and PrBa$_2$Cu$_3$O$_7$ may be used for the dielectric layer 215 and PrBa$_2$Cu$_3$O$_7$ may be used for the dielectric layer 216. For the layer 214, SrTiO$_3$ can be used without problem.

The material for the dielectric layer 214 is of course not limited to. SrTiO$_3$ that shows the large dielectric constant only in the low temperature environment. For example, one may use KTa$_{1-x}$Nb$_x$O$_3$ for the dielectric layer 214. By selecting the composition x to be about 0.05, this material shows the specific dielectric constant of about 30,000 at 70° K. Thus, this material is suitable for the transistors that use the oxide superconductor electrodes that show the superconductivity in the liquid nitrogen temperature.

As other sources of dielectric materials for the dielectric layer 214, one may use various oxides of titanium, tin, zirconium, niobium or tantalum such as titanium oxide (TiO$_2$). various titanates, stannates such as BaSnO$_3$, zirconates such as BaZrO$_3$, niobates such as LiNbO$_3$, and tantalates such as LiTaO$_3$. Alternatively, a plurality of these compounds may be mixed with an optimized composition such that the temperature that provides the maximum dielectric constant is adjusted. For example, one may lower the Curie temperature of BaTiO$_3$ (Tc=140° C.) by admixing SrTiO$_3$. CaSnO$_3$, BaSnO$_3$, BaZrO$_3$, and the like.

As for the material for the dielectric layers 215 and 216, various semiconductor materials also may by used. Such a semiconductor material includes the group IV semiconductors, the group III-V compound semiconductors, and the group II-VI compound semiconductors. Generally, the semiconductors have a small energy gap and are suitable for the dielectric layer 216.

Figure 23:
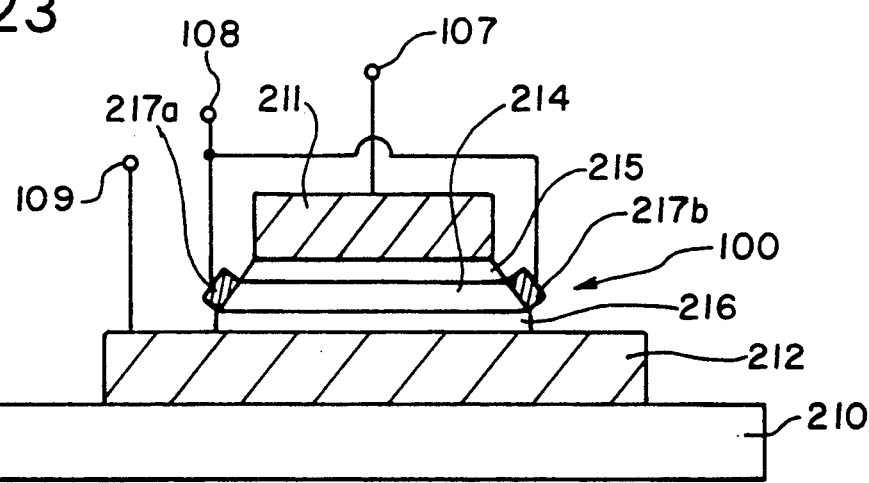
FIG. 23 is a diagram showing a modification of the transistor of FIG. 22.

FIG. 23 shows a modification of the structure of FIG. 22. In the drawing, those portions that correspond to the structure of FIG. 22 are designated by the same reference numerals and the description thereof will be omitted.

In this embodiment, the side wall of the dielectric structure 100 is etched with gradient in correspondence to the dielectric layer 214 and the dielectric layer 215. Thereby, the distance between the electrode 217a and the electrode 217b is reduced further and a more efficient control of the potential in the dielectric layer 214 is achieved. Such a structure having the oblique surface may be formed by applying a mask by a photoresist, and subjecting the structure to a dry etching process using CF$_4$ and oxygen as the etching gas. Thereby, the photoresist is oxidized with the progress of etching and the lateral boundary of the photoresist is shifted laterally. In response to such a change in the mask pattern with the progress of etching, the desired oblique surface is obtained.

In the transistor of the first and second embodiments, the deterioration of the device characteristics due to the base resistance as in the conventional bipolar transistor does not occur. Further, the problem of punch-through does not occur because of the use of the dielectric layer in stead of the base. Thereby, the device size can be reduced without being limited by the punch-through phenomenon and the device speed can be maximized. Further, such a reduction in the size is advantageous in reducing the parasitic capacitance and inductance.

Figure 24:
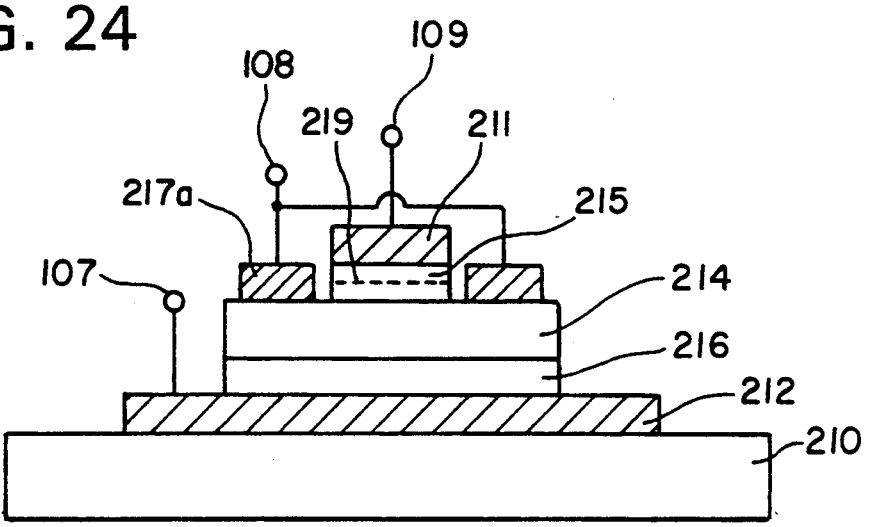
FIG. 24 is a diagram showing the structure of a transistor according to a third embodiment of the present invention.

FIG. 24 shows the transistor according to a third embodiment of the present invention, wherein those portions corresponding to the structure of FIG. 22 are designated by the same reference numerals and the description will be omitted.

Figures 25, 26:
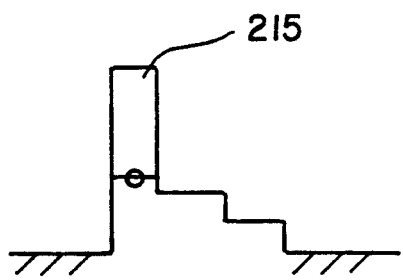
FIG. 25 is a diagram showing a resonant structure used in the transistor of FIG. 24.
FIG. 26 is a diagram showing another resonant structure used in the transistor of FIG. 24.

In this embodiment, a resonant structure 219 is formed in the first dielectric layer 215. Such a resonant structure may be formed by incorporating a deep impurity level in the dielectric layer 215 as shown in FIG. 25 or by forming a quantum well structure in the dielectric layer 215 as shown in FIG. 26. In the structure of FIG. 25, one may introduce gold into the silicon oxide layer forming the layer 215 by ion implantation with the concentration level of $10^{17}$ cm$^{-3}$ or more. On the other hand, in the structure of FIG. 26, a thin layer of silicon or GaAs may be interposed between a pair of silicon oxide layers with a thickness substantially smaller than 1000 Å. By providing such a resonant structure 219 in the layer 215, a non-linear characteristic that cannot be achieved in other constructions, can be achieved.

Figure 27:
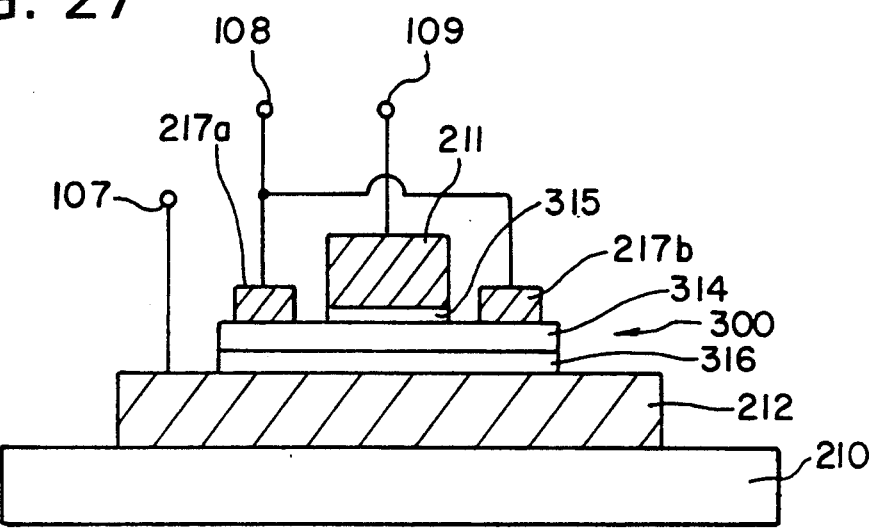
FIG. 27 is a diagram showing a transistor according to a fourth embodiment of the present invention.

Next, a fourth embodiment of the present invention will be described with reference to FIG. 27. In FIG. 27, the parts that correspond to the parts of FIG. 22 are designated by the identical reference numerals and the description thereof will be omitted.

The structure of FIG. 27 has a layered dielectric structure 300 in place of the dielectric structure 100, wherein the structure 300 comprises a first dielectric layer 315 in contact with the emitter region 211, a third dielectric layer 316 in contact with the collector region 316, and an intervening, second dielectric layer 314 interposed between the layers 315 and 316. Similar to the structure of FIG. 22, the first layer 315 has a first dielectric constant $\epsilon_1$, the second layer 314 has a second dielectric constant $\epsilon_2$ and the third layer 316 has a third dielectric constant $\epsilon_3$, wherein the dielectric constant $\epsilon_2$ is substantially larger than the dielectric constants $\epsilon_1$ and $\epsilon_3$. Thus, the potential level in the layered dielectric structure 300 is controlled in response to the control voltage applied to the control electrodes 217a and 217b. The value of $\epsilon_1$ and $\epsilon_3$ may be 8 when silicon oxide is used for the layers 315 and 316. On the other hand, the dielectric constant $\epsilon_2$ may take the value of about 20,000 when SrTiO$_3$ is used for the layer 314. The thickness of the layer 315 and 316 may be set to about 10 nm while the thickness of the layer 314 may be set to about 500 nm.

Figure 29:
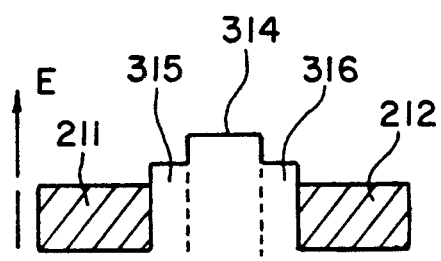
FIGS. 29-31 are band diagrams showing the band structure and operation of the transistor of FIG. 27.

FIG. 29 shows the band structure of the layered dielectric structure 300 in the state where no control voltage is applied. As can be seen in this diagram, the second dielectric layer 314 forms the highest potential barrier in the structure 300 and controls the flow of electrons from the emitter layer 211 to the collector layer 212 in response to the control voltage applied to the control electrodes 217a and 217b.

Figure 30:
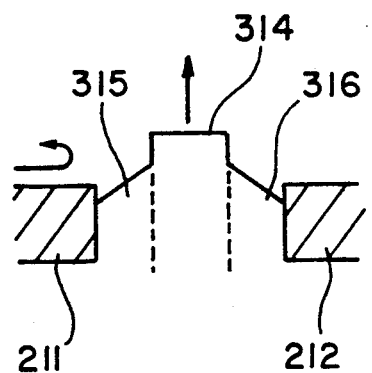

FIG. 30 shows the band structure corresponding to FIG. 29 in the state that a large negative voltage is applied to the control electrodes 217a and 217b. In this case, the potential barrier at the dielectric layer 314 is raised because of the negative electric charges induced in the layer 314 as a result of polarization. The penetration of the control voltage into the layer 314 is described already with reference to the first embodiment.

Figure 31:
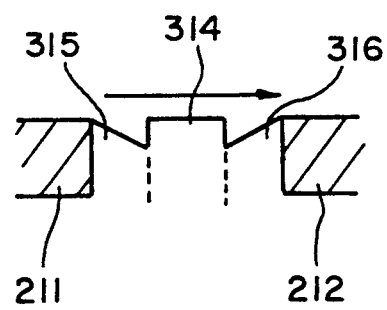

In the state of FIG. 31 showing the band structure for the case where a positive control voltage is applied, on the over hand, the potential barrier at the layer 314 is lowered and the electrons can flow from the emitter layer 211 to the collector layer 212 along the conduction band of the layers 314–316, when a suitable drive voltage is applied across the layers 211 and 212. Thus, the device of FIG. 27 operates as a transistor.

In order to realize the band structure of FIG. 29, various combination of materials may be possible. For example, ZnO may be used for the layers 315 and 316 in combination with SrTiO$_3$ forming the layer 314. Alternatively, silicon may be used for the layers 315 and 316 to reduce the barrier height in these layers. Further, the superconductors may be used for the emitter and collector layers 211 and 212 similar to the case of the second embodiment. As the flow of electrons occur along the conduction band, the layer thickness of the layers 314, 315 and 316 is not critical in this embodiment.

Figure 28:
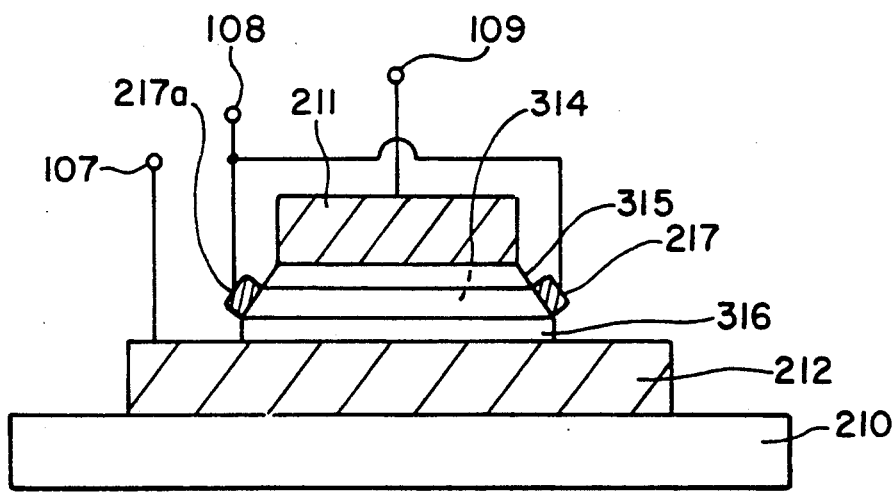
FIG. 28 is a diagram showing a modification of the transistor of FIG. 27.

FIG. 28 shows a modification of the structure of FIG. 27 corresponding to the structure of FIG. 23. Thus, the transistor of the present embodiment has the oblique surfaces in the structure 300 in correspondence to the dielectric layers 314 and 315. As the construction and operation of this embodiment are obvious from the foregoing description, the description of this embodiment will be omitted.

Next, a fifth embodiment of the present invention will be described. The present embodiment is also a tunnel transistor and has the structure substantially identical with the structure of FIG. 22. Thus, the description of structure of the device will be omitted. In this embodiment, too, the dielectric layer 314 has the extremely large dielectric constant and controls the potential level therein in response to the control voltage applied to the control electrode.

Figure 32:
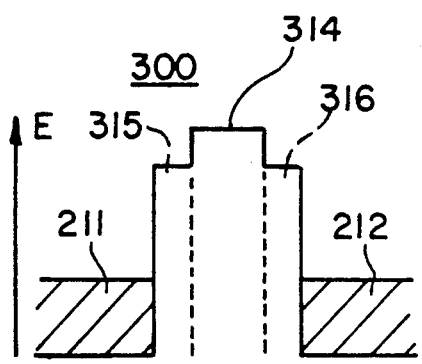
FIGS. 32 and 33 are band diagrams showing the band structure of a transistor according to a fifth embodiment of the present invention.

Referring to the band diagram of FIG. 32, the present embodiment has the dielectric layered structure 300 forming a tunneling barrier. For this purpose, each layer 314, 315 and 316 has a reduced thickness as compared to the corresponding structure 300 of FIG. 29. Thus, the layer 315 and 316 of ZnO has the thickness of 20 Å, and the layer 314 has the thickness of about 60 Å. Similar to the case of the previous embodiments, the layer 314 is formed from SrTiO$_3$.

Figure 33:
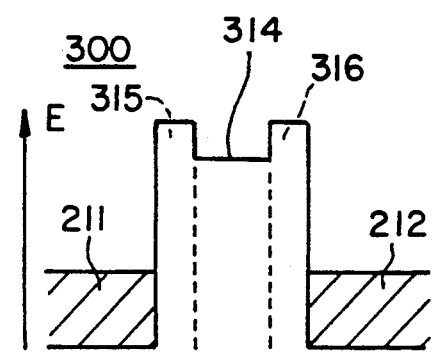
Figure 34:
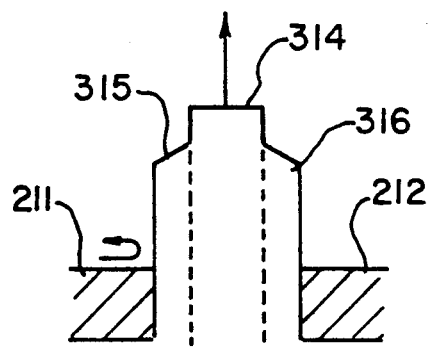
FIGS. 34 and 35 are band diagrams showing the band structure of a transistor according to a sixth embodiment of the present invention.

In the present embodiment, the relative barrier height is not important. Thus, the dielectric layered structure 300 may have the band diagram as shown in FIG. 33, wherein the barrier height of the dielectric layers 315 and 316 is higher than the barrier height of the layer 314.

In response to the application of a negative voltage to the control gates 217a and 217b, negative charges are induced in the layer 314, and the energy barrier in the structure 300, formed by the conduction band of the layers 314–316, is raised. Thereby, the tunneling probability of the electrons thorough the structure 300 is decreased and the current is shut off.

Figure 35:
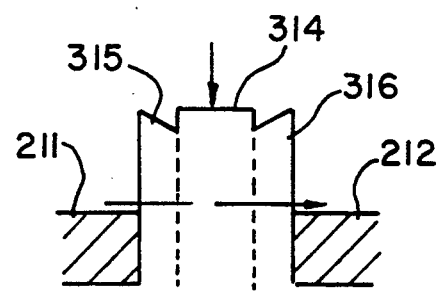

In the case of FIG. 35 where a positive control voltage is applied, the barrier height in the structure 300 is lowered and in response to this, the tunneling probability of the electrons increases. Thereby, the electrons flow from the emitter layer 211 to the collector layer 212. Thus, the present embodiment provides a tunneling transistor of vertical construction of which conduction is controlled by the control voltage applied to the control electrodes 217a and 217b.

In this embodiment, too, the use of superconductors for the emitter layer 211 and the collector layer 212 provides a preferable speed up of the operation due to the reduced time constant.

Figure 36:
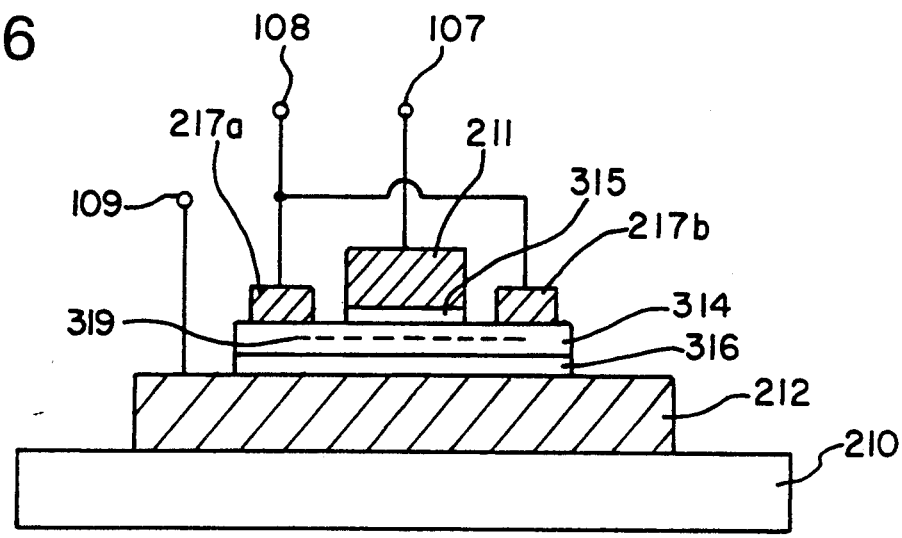
FIG. 36 is a diagram showing the structure of a transistor according to a seventh embodiment of the present invention.

FIG. 36 shows a seventh embodiment of the present invention. In FIG. 36, the parts that are identically constructed as in the structure of FIG. 22 are designated by the identical reference numerals and the description will be omitted.

In this embodiment, a resonant structure 319 is formed in the second dielectric layer 314. Such a resonant structure may be formed by replacing about 5% of Sr atoms by Nb atoms in correspondence to the central level of the layer 314. Thereby, the layer of Nb atoms is formed parallel to the layer 314 between the upper surface and the lower surface thereof. The incorporation of the Nb atoms may be achieved by the ion implantation process.

Figure 37:
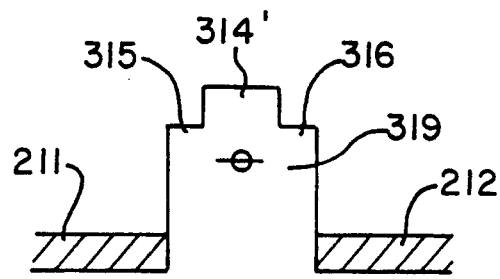
FIGS. 37 and 38 are band diagrams showing the band structure and operation of the transistor of FIG. 36.
Figure 38:
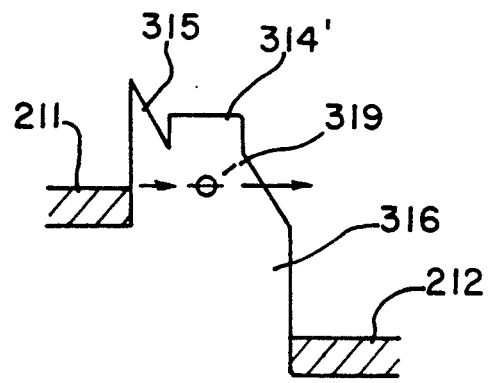

The Nb atoms thus substituting the site of the Sr atoms act as the donor and forms a deep donor level as shown in FIG. 37. Thus, the electrons having the energy level coincident to the deep donor level are passed selectively through the layered dielectric structure 300. Referring to FIG. 38 showing the biased state, a large current would flow between the emitter and the collector when the deep donor level 315 is set substantially coincident to the energy level of the electrons injected from the emitter layer 211. This condition of resonance can be achieved for various combination of the control voltage and the emitter-collector voltage. The resonant tunnel transistor having such a property generally shows a strong non-linearity and has a superior sensitivity to the usual tunnel transistors.

Figure 39:
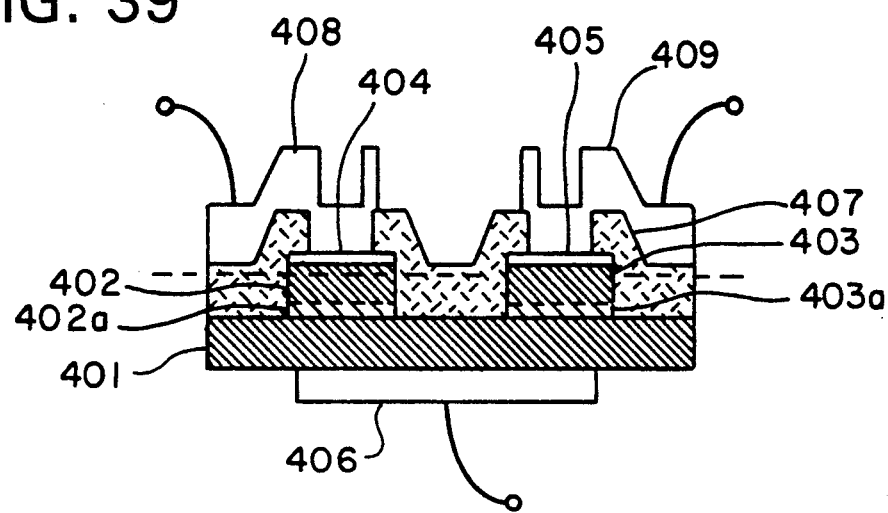
FIG. 39 is a diagram showing the structure of a transistor according to an eighth embodiment of the present invention.
Figure 40:
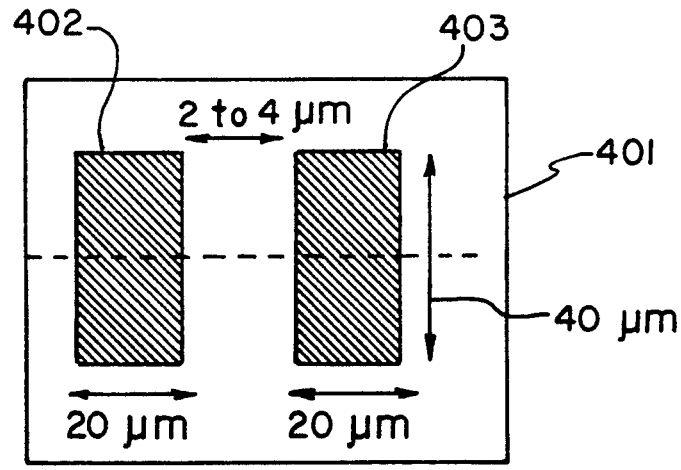
FIG. 40 is a diagram showing the structure of the transistor of FIG. 39 in the plan view.

Next, an eighth embodiment of the present invention will be described with FIGS. 39 and 40, wherein FIG. 39 shows the cross section and FIG. 40 shows the plan view.

Referring to FIG. 39, the device of the present invention is a planar tunnel transistor and comprises a substrate 401 of a dielectric material having a large dielectric constant such as SrTiO$_3$. The substrate may be a plate of SrTiO$_3$ having a thickness of 500 μm and has a (100) surface.

On the dielectric substrate 401, there is provided a superconducting emitter region 402 and a superconducting collector region 403, both of a high temperature superconductor such as YBa$_2$Cu$_3$O$_{7-x}$. Further, a control electrode 406 is provided on the rear side of the SrTiO$_3$ substrate 401. This control electrode may be merely a silver paste connecting a lead wire to the substrate 401. The superconducting emitter and collector regions 402 and 402 are covered by an insulating layer 407 of BaF$_2$, and a niobium superconducting electrodes 408 or 409 are provided on the layer 407 in correspondence to the emitter region 402 and the collector region 403. The electrode 408 makes a contact with the gold layer 404 of the underlying emitter region 402 via a contact hole provided in the insulating layer 407, and the electrode 409 makes a contact with the gold layer 405 of the underlying collector region 403 via a contact hole provided in the insulating layer 407.

In the plan view, the emitter region 402 and the collector region 403 have a rectangular form of 20 μm×40 μm, with a mutual separation of 2–4 μm as shown in FIG. 40. The emitter and collector regions 402 and 403 have a thickness of 40–100 nm, and a gold film 404, 405 of 50 nm thickness is formed on the top surface of each region.

Figure 41A:
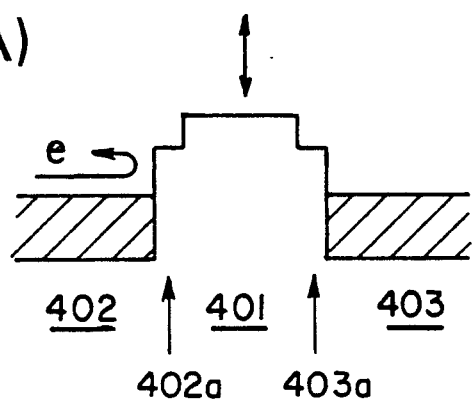
FIGS. 41(A) and 41(B) are band diagrams of the transistor of FIG. 39 for explaining the operational principle thereof.
Figure 41B:
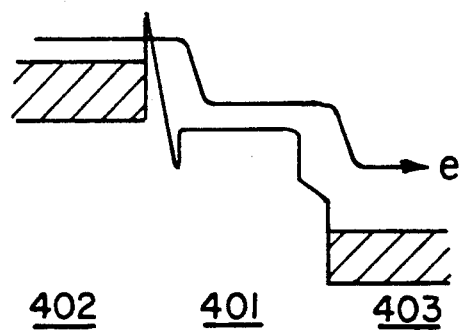

In this structure, there are formed layers 402a and 403a respectively between the emitter region 402 and the substrate 401 and between the collector region 403 and the substrate 401 such that the layers 402a and 403a have a dielectric constant different from the dielectric constant of the substrate 401. Thereby, the substrate 401 forms a potential barrier, together with the layers 402a and 403a, between the emitter region 402 and the collector region 403 as shown in the band diagram of FIG. 41(A), wherein the barrier height is controlled in response to the control voltage applied to the control electrode 406 at the rear surface of the substrate 401. Because of the large dielectric constant of the material forming the substrate 401, the control voltage at the control electrode 406 controls the barrier height similarly to the foregoing embodiments. Thus, when the barrier height representing the level of the conduction band in the substrate 401 is decreased below the level of electrons in the emitter region 402, in response to the control voltage applied to the control electrode 406, the obstacle against the passage of electrons disappears and the electrons start to flow from the emitter region 402 to the collector region 403, provided that there is a suitable drive voltage applied across the regions 402 and 403 as shown in the band diagram of FIG. 41(B).

Figure 42:
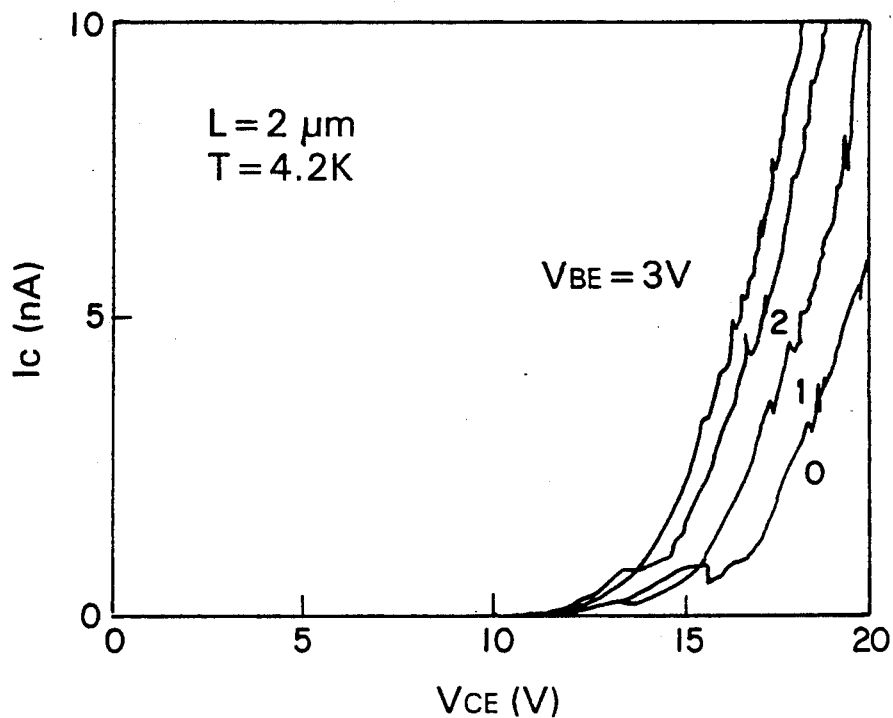
FIG. 42 is a graph showing the characteristic of the transistor of FIG. 39.
Figure 43:
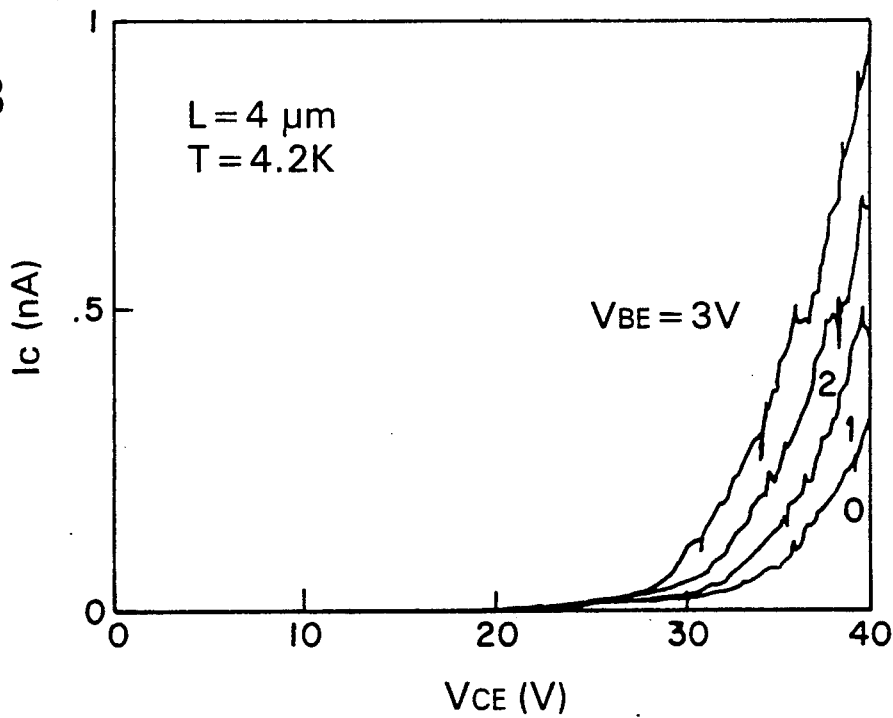
FIG. 43 is another diagram showing the operational characteristic of the transistor of FIG. 39 in the different size.

FIGS. 42 and 43 show the relationship between the collector current Ic flowing between the collector region 402 and the emitter region 403 as a function of the drive voltage applied across the regions 402 and 403, while changing the control voltage $V_{BE}$ at the control electrode 406 variously. Here, the voltage $V_{BE}$ is measured with reference to the emitter voltage at the emitter region 403. FIG. 41 shows the result for the device wherein the separation between the emitter region 402 and the collector region 403 is set at 2 μm. FIG. 42, on the other hand, shows the result for the device wherein the separation between the emitter region 402 and the collector region 403 is set at 4 μm. Both experiments were undertaken at the liquid helium temperature of 4.2° K.

As can be seen clearly in both diagrams, the collector current Ic is changed in response to the control voltage $V_{BE}$ and the device of FIG. 39 shows the transistor action, with the current gain substantially exceeding 1. About the voltage gain $G_V$ defined as $G_V = -\delta V_{CE}/\delta V_{BE}$, a value of 1.5–2 is obtained. The observed high current gain is obviously the result of the low leak current to the substrate 401.

FIGS. 44(A)–44(D) show the fabrication process of the device of FIG. 39.

Figure 44A:
FIGS. 44(A)-44(D) are diagrams showing the process of fabrication of the transistor of FIG. 39.

Referring to the drawings, the transistor fabrication begins with chemical treatment of the SrTiO$_3$ substrate 401 in a concentrated HCL solution for 1 minute. A YBa$_2$Cu$_3$O$_{7-x}$ film is then deposited over the entire substrate using laser ablation. A stoichiometically sistered YBa$_2$Cu$_3$O$_{7-x}$ target is ablated by a KrF eximer laser at a power density of 4J/cm$^2$ in the 1.3 Pa oxygen gas ambient. The deposition rate may be set to 0.07–0.17 nm/min (0.01–0.03 nm/pulse) with a critical film temperature around 85°K. The deposition rate may be varied on the surface of the substrate, with the center of the substrate having the highest rate. The YBa$_2$Cu$_3$O$_{1-7}$ layer is grown with the thickness of 40–100 nm. After the YBa$_2$Cu$_3$O$_{1-7}$ layer is grown as such, a 50 nm-thick gold film is deposited on the layer. Thereby, the structure shown in FIG. 44(A) is obtained.

Figure 44B:
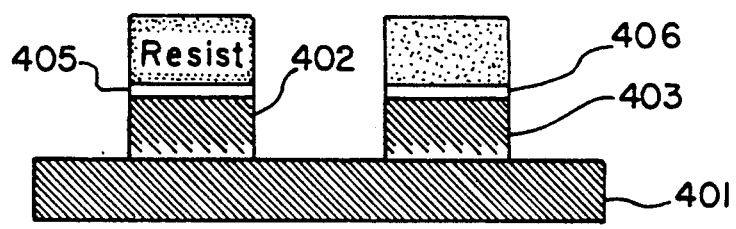

Next, the layer of $YBa_2Cu_3O_{7-x}$ is patterned, including the gold layer thereon and an Ar-ion beam etching process is applied to form the emitter region 402 and the collector region 403 as shown in FIG. 44(B). The etching process may be conducted by using the Arion acceleration voltage of 0.5 kV and the current density of 0.26 $mA/cm^2$. Thereby, an etching rate of 10 nm/min is obtained.

Figure 44C:
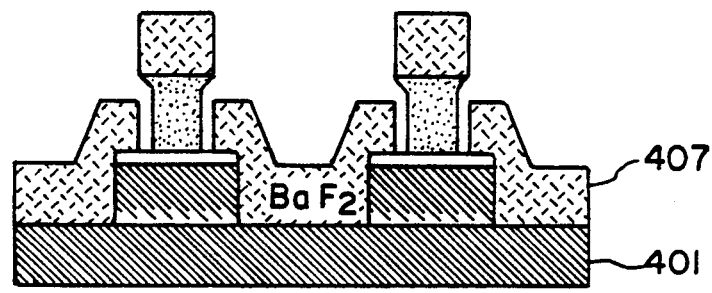
Figure 44D:
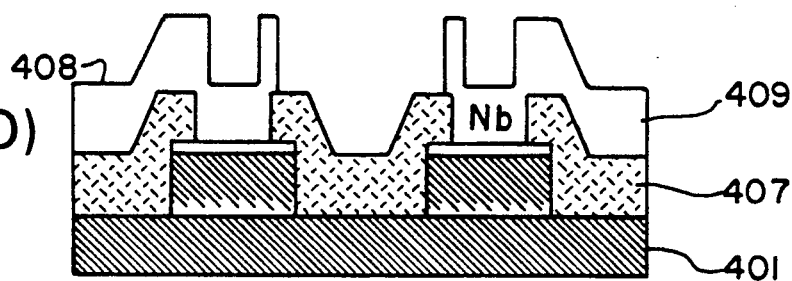

Next, in the process of FIG. 44(C), a photoresist mask is provided in correspondence to the contact holes to be formed, and the entire surface of the substrate is covered by the $BaF_2$ insulation layer with the thickness of 360 nm.

After lifting off the photoresist mask, the entire structure is sputter-cleaned at argon pressure of 1.3 Pa with an RF power density or 0.2 $W/cm^2$ for 5 min. Next, a Nb interconnection layer is sputter-deposited with the thickness of 500 nm, and patterned subsequently to form the interconnection patterns 408 and 409. Thereby, the structure of FIG. 44(D) corresponding to the structure of FIG. 39 is obtained.

Figure 45:
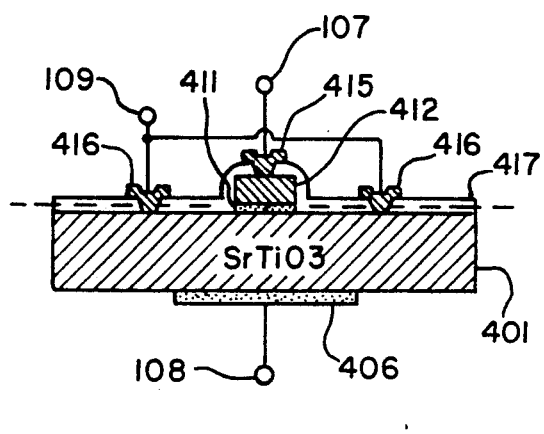
FIG. 45 is a diagram showing the structure of a transistor according to a ninth embodiment of the present invention.

FIG. 45 shows a tunnel transistor according to a ninth embodiment of the present invention. In FIG. 45, those parts that correspond to the structure of FIG. 39 are designated by the identical reference numerals.

In this embodiment, an emitter region 412 of Nb is provided on a silicon oxide or silicon thin barrier layer 411 that is formed on the upper major surface of the substrate 401. The barrier layer 411 typically has a thickness of 6 nm while the Nb emitter region 412 may have a thickness of 260 nm. The surface of the substrate 401 is covered, including the emitter region 412, by a silicon oxide insulating layer 417, and a Nb contact electrode 415 is provided on the emitter region 412 in correspondence to the electrode 107 via a contact hole in the silicon oxide insulating layer 417. Further, a Nb collector region 416 is provided in contact with the upper major surface of the substrate 401 via a contact hole formed in the silicon oxide insulating layer 417. Further, a control electrode 406 is provided on the lower major surface of the substrate similar to the embodiment of FIG. 39.

Figure 46:
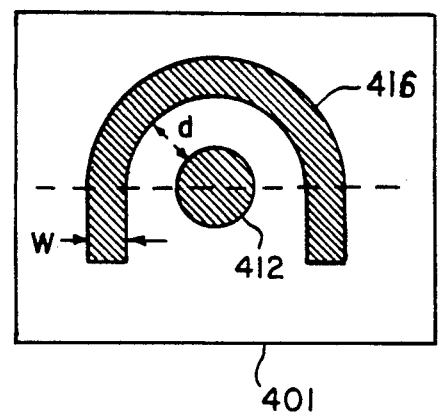
FIG. 46 is a diagram showing the structure of the transistor of FIG. 45 in the plan view.

FIG. 46 shows the plan view of the transistor of FIG. 45. As can be seen, the emitter region 412 has a circular shape with the diameter of about 30 μm. The collector region 416, in turn, is formed in the semicircular strip surrounding the emitter region 412 with a separation d of 15 μm. The collector region 416 may have a width w of 10 μm.

In operation, the electrons released by the emitter region 412 pass through the barrier layer 411 by tunneling and reaches the collector region 416 along the conduction band of the substrate 401. The barrier height in the substrate 401 is changed in response to the control voltage applied to the control electrode.

Figure 49:
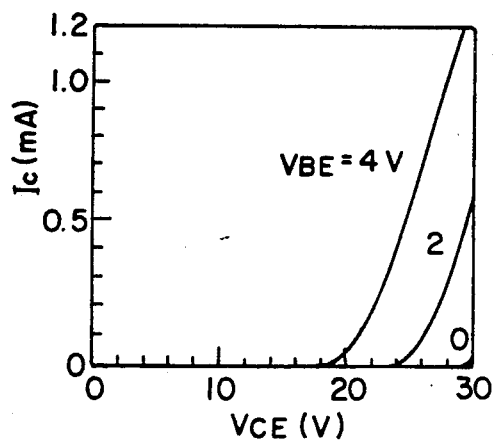
FIGS. 49 and 50 are diagrams showing the operational characteristics of the transistor of FIG. 45.
Figure 50:
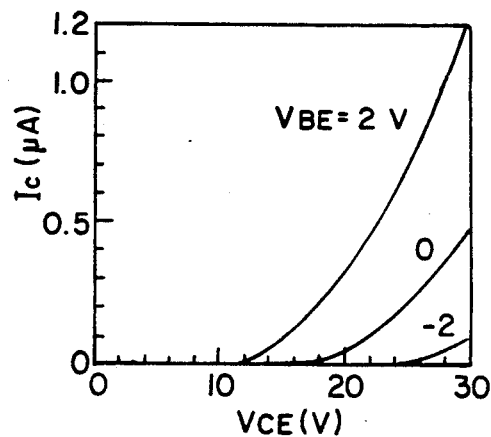
Figure 52:
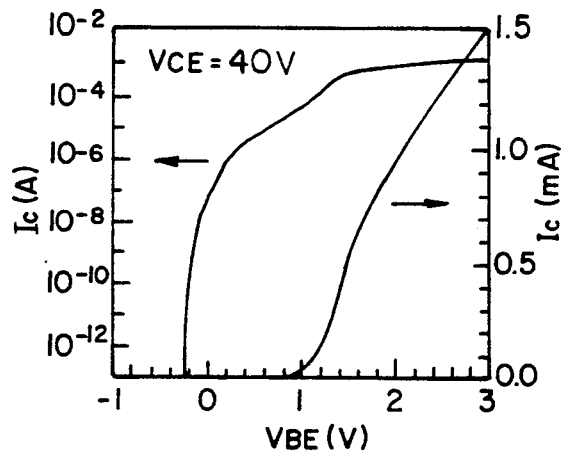
FIG. 52 is a diagram showing the operational characteristics of the transistor of FIG. 45.

FIGS. 49, 50 and 52 show the operational characteristics of the transistor of FIG. 45, wherein FIG. 49 represents the result for the device wherein silicon is used for the barrier layer 411 in Combination with the substrate 401 having the thickness of 0.5 mm, while FIG. 50 represents the result for the device wherein silicon oxide is used for the barrier layer 411 in combination with the substrate having the thickness of 0.3 mm. From these drawings, it is clearly shown that the device of FIG. 45 operates as the transistor and the current gain for the transistor of the present invention substantially exceeds 1. Further, this device shows the voltage gain $G_V$ of 2.5 when silicon is used for the barrier layer 411.

FIG. 52, on the other hand, shows the collector current $I_C$ as a function of the control voltage $V_{BE}$ under a constant drive voltage $V_{CE}$ of 40 volts across the emitter region 412 and the collector region 416. In the drawing, the characteristic is shown in two different scales, one at the right vertical axis and the other at the left vertical axis. From this diagram, one can see a very stringent cut-off voltage at about 0.2 volts, above which the collector current $I_C$ increases suddenly. It was found that the transistor having the silicon barrier layer 411 shows the transconductance of 1.4 mS under the $V_{CE}$ set to 40 volts when the collector current $I_{CE}$ is set at 0.3 mA in response to the control voltage $V_{BE}$ of 1.4 volts.

Next, a tunnel transistor according to a tenth embodiment of the present invention will be described with reference to FIGS. 47 and 48. In this embodiment, in addition to the barrier layer 411 and the emitter region 412, another barrier layer 421 of silicon or silicon oxide is provided on the upper major surface of the substrate 401 adjacent to the barrier layer 411 with a thickness of 6 nm, and a collector region 422 of Nb is provided on the region 412 with a thickness of 260 nm. Thereby, the silicon oxide insulator layer 417 covers the upper major surface of the substrate 401 including the emitter and collector regions 412 and 422. Further, the collector region 422 is connected to the collector electrode 109 via a contact electrode 425 provided in the insulating layer 417 in correspondence to the collector region 422. Similarly to the structure of FIG. 45, the device of the present embodiment has the control electrode 406 provide at the lower major surface of the substrate 401.

Figure 47:
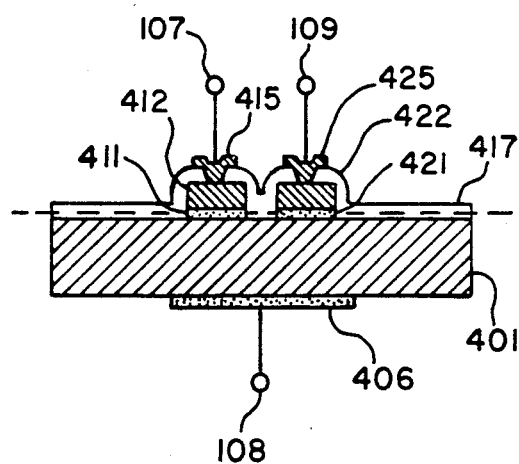
FIG. 47 is a diagram showing the structure of a transistor according to a tenth embodiment of the present invention.
Figure 48:
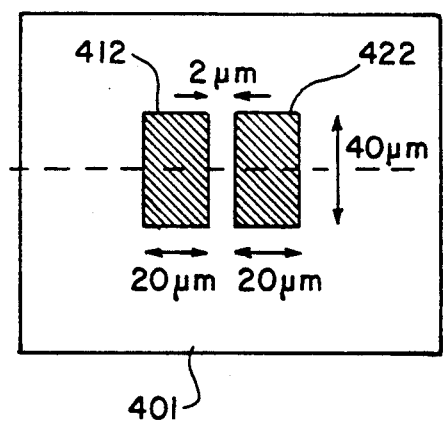
FIG. 48 is a diagram showing the transistor of FIG. 47 in the plan view.

FIG. 48 shows the plan view of the device of FIG. 47. As can be seen in this diagram, the emitter region 412 and the collector region 422 have a rectangular form with a size of 20 μm × 40 μm. Further, the region 412 is separated from the region 422 by a distance of 2 μm.

In operation, the potential level in the substrate 401 is changed in response to the control voltage applied to the control electrode 406. When there is a suitable drive voltage applied across the emitter region 412 and the collector region 422, the electrons start to flow, in response to the control voltage that causes the lowering of level of the con conduction band of the substrate 411, from the emitter region 411 to the collector region 412, passing through the barrier layers 411 and 421. The band structure for this process will be described layer with reference to another embodiment.

Figure 51:
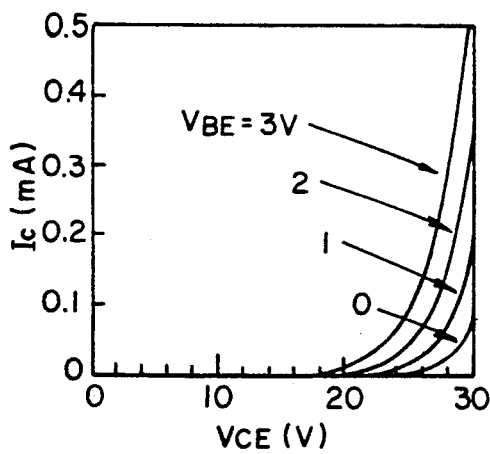
FIG. 51 is a diagram showing the operational characteristics of the transistor of FIG. 47.

FIG. 51 shows the collector current Ic as a function of the drive voltage $V_{CE}$ applied across the emitter region 412 and the collector region 422, while changing the control voltage variously. As can be seen clearly in this drawing, the device of FIG. 47 shows the transistor action with the current gain substantially exceeding 1. Further, this device shows the voltage gain $G_V$ of about 2.

Next, the fabrication process of the device of FIG. 47 will be described.

For the substrate 401, a single crystal of $SrTiO_3$ grown by the Bernoulli method is used. The surface of the substrate 401 is polished mechanically to give an optical-grade surface. The substrate 401 thus obtained is subjected to an in-situ cleaning process using the oxygen RF plasma for 5 minutes at 6.7 Pa of pressure under the RF power density of 0.1 $W/cm^2$. Next, the silicon and Nb layers are deposited over the entire upper surface of the substrate by the RF magnetron sputtering. The silicon layer is deposited with the thickness of 6 nm in correspondence to the barrier layers 411 and 421, while the Nb layer is deposited with the thickness of 260 nm in correspondence to the emitter and collector regions 412 and 422. Alternatively, a layer of silicon oxide having a thickness of 2 nm may be deposited by sputtering in place of the silicon layer.

After the Nb layer forming the emitter and collector regions 411 and 412 is deposited, the Nb layer is patterned together with the underlying silicon or silicon oxide layer by the reactive ion etching process, using a CF$_4$ etching gas containing 5% oxygen. Thereby, the emitter region 412 and the collector region 412 are formed. During the etching, an over-etching is applied for about 90 seconds to ensure no residual silicon or silicon oxide layer remained between the emitter region 412 and the collector region 422. Further, the entire surface of the structure thus obtained is covered by the silicon insulator layer 417 that is deposited by the RF magnetron sputtering process with the thickness of 450 nm. Further, after the formation of the contact holes by the reactive ion etching process and subsequent RF sputter-cleaning process, the Nb interconnection layer is deposited with the thickness of 650 nm and patterned subsequently.

Figure 53:
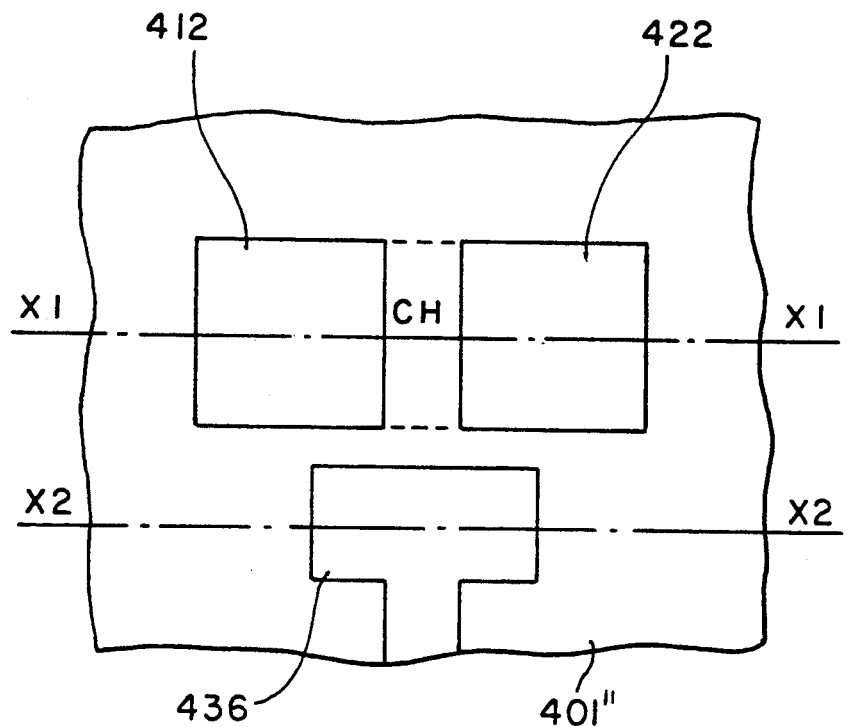
FIG. 53 is a diagram showing a transistor according to an eleventh embodiment of the present invention in the plan view.

FIG. 53 shows an eleventh embodiment of the present invention corresponding to a modification of the embodiment of FIG. 45. In FIG. 53, the parts that correspond to the parts of FIG. 45 are designated by the same reference numerals and the description will be omitted.

In the present embodiment, the control electrode 406 is not Provided on the lower major surface of the substrate 401 but on the upper major surface as a control electrode 436. Thus, as shown in the cross section of FIG. 54 corresponding to the cross section of FIG. 45, the control electrode 406 at the rear side of the substrate 401 is eliminated.

As shown in the plan view of FIG. 53, the control electrode 436 is provided offset from the channel CH of the electrons from the emitter region 412 to the collector region 422 and controls the level of the conduction band of the substrate 401 in response to the control voltage supplied thereto.

Figure 54:
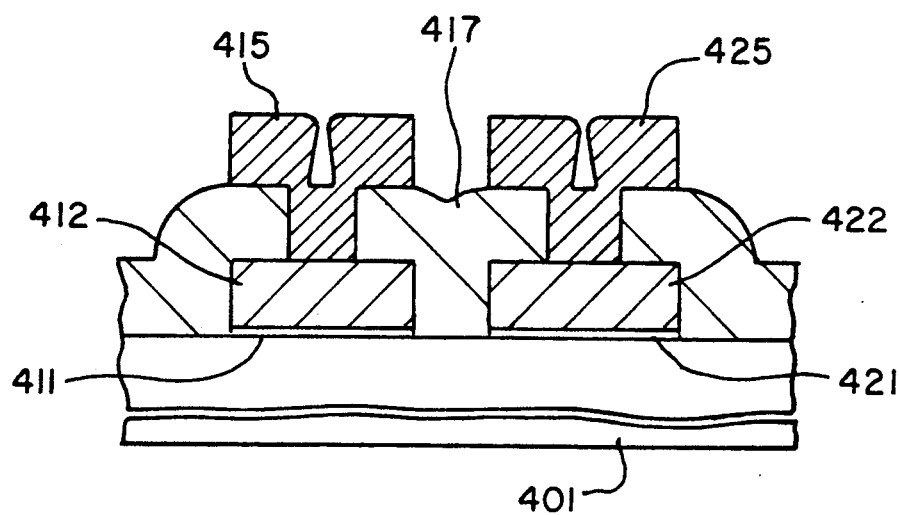
FIG. 54 is a diagram showing the transistor of FIG. 53 in the cross section.
Figure 55:
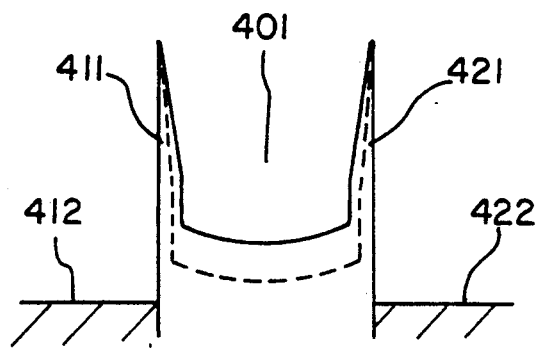
FIGS. 55 and 56 are band diagrams showing the band structure and operation of the transistor of FIG. 53.

FIG. 55 shows the band diagram of the device of FIG. 54, wherein this diagram shows the profile of the conduction band along the path from the emitter electrode 412 to the collector electrode, passing the barrier layer 411, the substrate 401 and the barrier layer 421. As can be seen, the barrier layers 411 and 412 form a thin but large potential barrier with the conduction band of the SrTiO$_3$ intervening therebetween. The level of the conduction band can be lowered in response to the control voltage applied to the control electrode 436, and the carriers cause the tunneling through the barrier layers 411 and 412.

Figure 56:
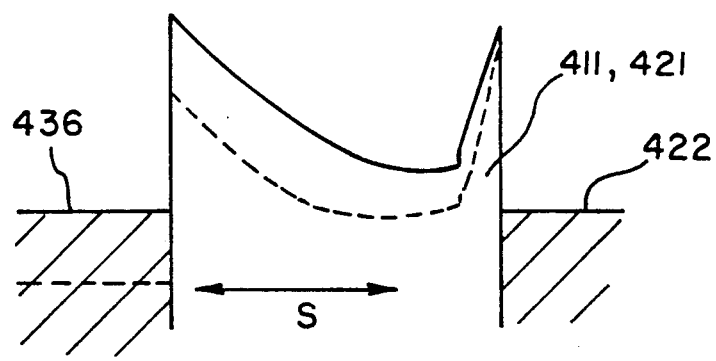

FIG. 56 shows the control of level of the conduction band of SrTiO$_3$ immediately under the emitter and collector regions 412 and 422, in response to the control voltage applied to the control electrode 436. Because of the extremely large dielectric constant of SrTiO$_3$ forming the substrate 401, the voltage applied to the electrode 436 induces a corresponding shift in the level of the conduction band in the substrate 401 that reaches the region immediately under the emitter and collector regions 412 and 422. Thereby, the flow of carries from the emitter region to the collector region is controlled in response to the control voltage applied to the control electrode 436.

As can be seen from the cross section of FIG. 54, the transistor of the present embodiment has substantially identical structure as the embodiment of FIG. 45, except that Ta, another typical superconductor, is used for the emitter region 412, collector region 422 and the contact electrodes 415, 425, in place of Nb. Thus, further description of this embodiment will be omitted.

Figure 57:
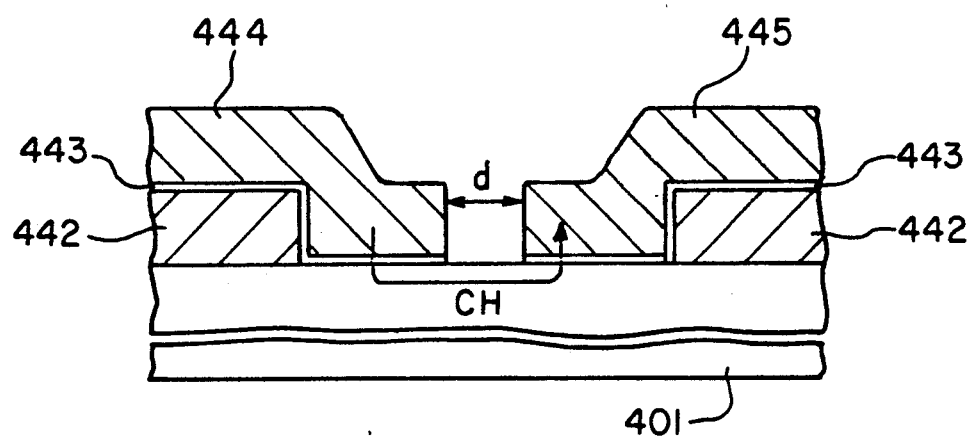
FIG. 57 is a diagram showing a transistor according to a twelfth embodiment of the present invention.
Figure 58:
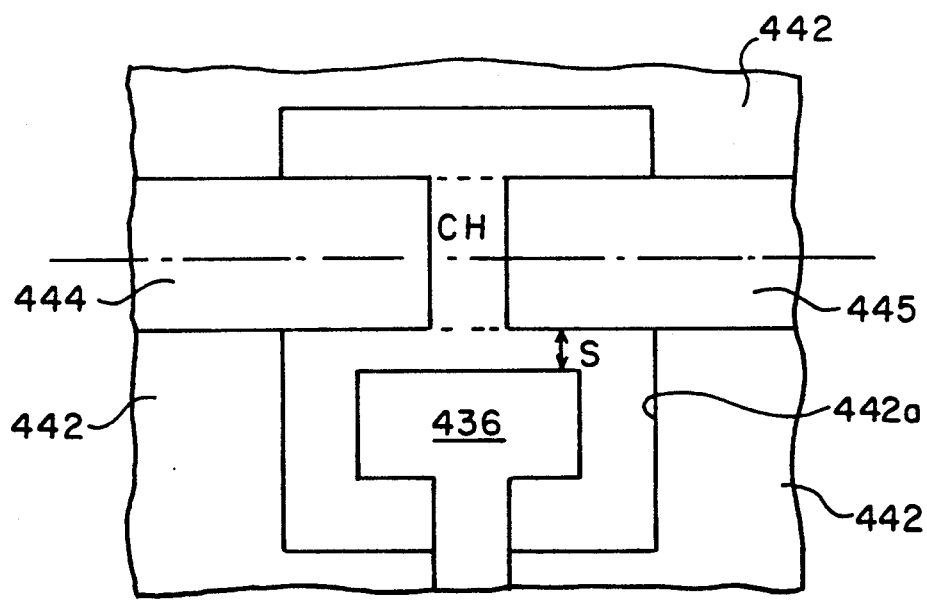
FIG. 58 is a diagram showing the structure of the transistor of FIG. 53 in the plan view.

FIG. 57 is a diagram showing a tunnel transistor according to a twelfth embodiment of the present invention and FIG. 58 shows the plan view of the device of FIG. 57.

Referring to FIG. 57, the SrTiO$_3$ substrate 401 is covered by a silicon oxide insulator layer 442 of 200 nm thick, and there is provided a rectangular cutout 442$a$ (FIG. 58) in the layer 442, exposing the upper surface of the substrate 401. On the insulator layer 442, a barrier layer 443 of silicon oxide is deposited uniformly with a thickness of 2 nm including the exposed surface of the substrate 401 that is exposed by the cutout 442$a$, and there is provided a pair of mutually opposing conductors 444 and 445 on the barrier layer 443 as the emitter and collector regions. The conductors 444 and 445 extend into the cutout region defined by the cutout 442$a$ and is located on the barrier layer 443 covering the exposed part of the substrate surface. The both conductors comprise Ta and may have a thickness of 260–300 nm.

In the cutout region defined by the cutout 442$a$, the barrier layer 443 is eliminated except for those parts located underneath the emitter and collector regions 444 and 445, and a control electrode 436 is provided in direct contact with the exposed surface of the substrate 401. As shown in the plan view of FIG. 58, the control electrode 436 is provided offset from the channel CH of electrons flowing from the emitter region 444 to the collector region 445 such that no diversion of carrier will occur to the control electrode.

The separation d between the emitter region 444 and the collector region 445 is set to about 2–3 $\mu$m. On the other hand, the separation s between the gate electrode 436 and the channel CH of the electrons is set at least larger than 20–30 Å, preferably larger than 200–300 Å to avoid the flowing of tunnel current from the channel CH to the control electrode 436.

The band diagram of FIGS. 55 and 56 also holds true for the case of the present invention. Thus, the electrons can flow from the emitter region 444 to the collector region 445, passing through the barrier layer 443 under the region 444 by tunneling, passing though the channel CH of the substrate 401 along the conduction band of SrTiO$_3$, passing through the barrier layer 443 under the collector region 445, and finally reaching the collector region 445. The level of the conduction band is controlled in response to the control voltage applied to the control terminal 436 as shown in FIGS. 56, wherein the existence of a potential barrier between the control electrode 436 and the channel of electrons effectively prevents the diversion of the electrons into the control electrode. In FIG. 56, the distance s corresponding to the separation s of FIG. 58 is substantially larger than the tunneling length of the electrons.

Figure 59:
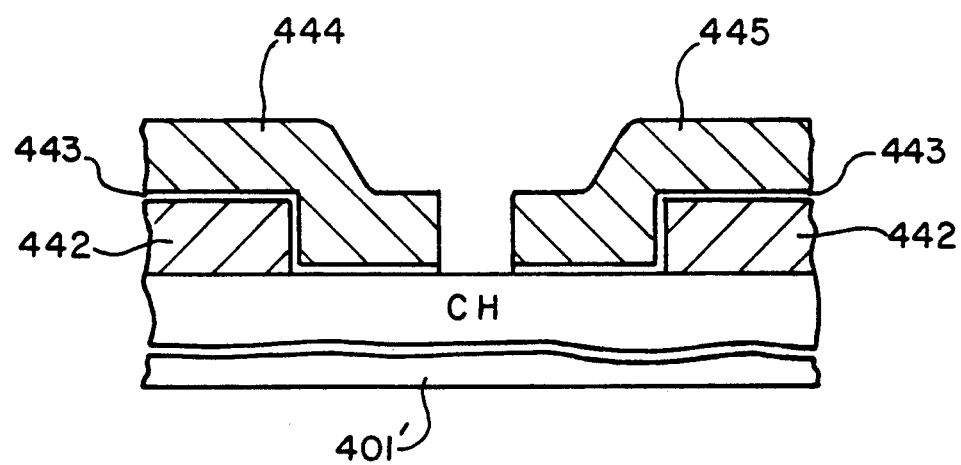
FIG. 59 is a diagram showing a transistor according to a thirteenth embodiment of the present invention.

Next, a tunnel transistor according to a thirteenth embodiment of the present invention will be described with reference to FIG. 59. In the present embodiment, those parts corresponding to the parts of the structure described previously are designated by the same reference numerals and the description thereof will be omitted.

In this embodiment, a substrate 401' is used in place of the substrate 401 wherein about 0.001% of Sr atoms in the SrTiO$_3$ are replaced by Nb atoms that act as the donor. Thereby, the positive donor level formed in the substrate 401' shifts the potential level of the channel CH and the potential barrier provided by the conduction band of SrTiO$_3$ is reduced to the value of 2 meV–20 meV that is suitable for the tunneling of electrons. In other words, the transistor of the present embodiment is capable of operating at the near-zero bias voltage for the control electrode 436. Depending on the needs, acceptors may be introduced in place of donors.

Figure 60:
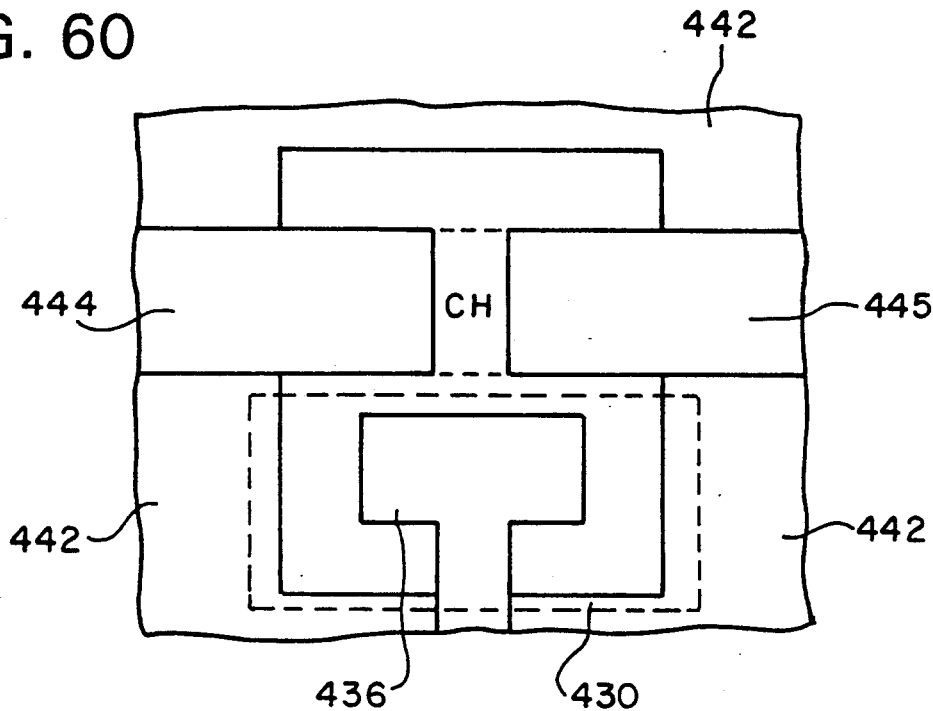
FIG. 60 is a diagram showing the transistor of FIG. 59 in the plan view.

FIG. 60 shows the tunnel transistor according to a modification of the thirteenth embodiment. In this modification, the area of the substrate 401' that the donor is introduced is limited to an area 430 in the vicinity of the control electrode 436. More precisely, the area 430 is selected such that it is separated from the channel region CH and confined about the electrode 436. According to the present embodiment, the formation of unwanted carriers that may be formed in the channel region CH due to the doping of the substrate 401' is eliminated and a proper operation of the tunnel transistor is guaranteed. Alternately, the entire substrate 401' may be doped by a donor to a low concentration level as in the case of FIG. 59 and the region 430 is doped to an increased level.

Figure 61:
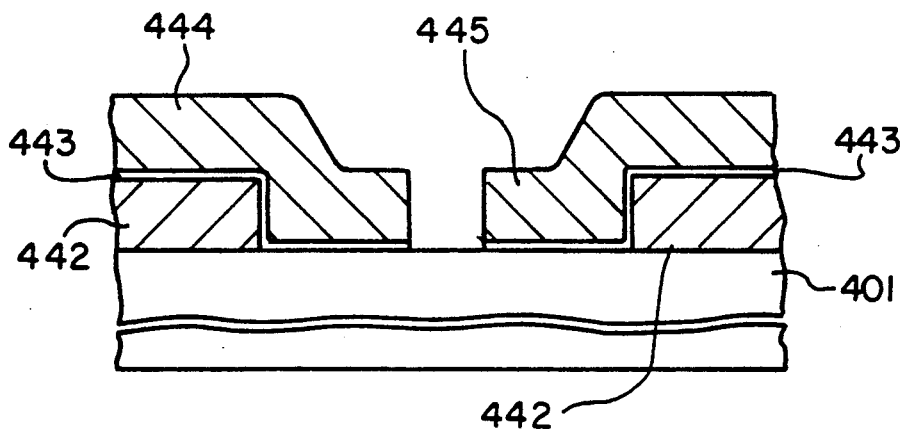
FIG. 61 is a diagram showing the structure of a transistor according to a fourteenth embodiment of the present invention.

FIG. 61 is a diagram showing a tunnel transistor according to a fourteenth embodiment of the present invention. This transistor has a structure substantially identical with the structure of FIGS. 57 and 58 and the description of structure operation will be omitted.

In this embodiment, YAlO$_3$ is used for the insulating layer 442 and the barrier layer 443, while YBa$_2$Cu$_3$O$_x$, a high temperature superconductor, is used for the emitter and collector regions 444 and 445. BY using the high temperature superconductor for the emitter and collector regions, further increase in the sensitivity and operational speed of the transistor is expected. The high temperature superconductor also may be used for the control electrode 436. Further, other superconductors such as Nb described previously or Pb alloy may be employed.

Figure 62:
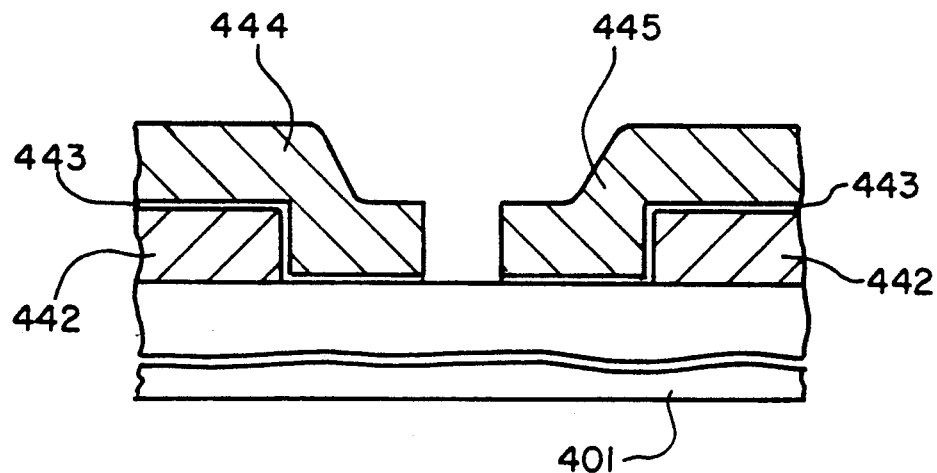
FIG. 62 is a diagram showing a transistor according to a fifteenth embodiment of the present invention.

FIG. 62 shows a tunnel transistor according to a fifteenth embodiment of the present invention, wherein the transistor has a structure substantially identical with the transistor of FIG. 62 except for the substrate that is replaced by a substrate 401".

In this embodiment, the substrate 401" has a composition represented as KTa$_{1-x}$Nb$_x$O$_3$ wherein the composition x is determined to be about 0.05 such that the material has the maximum dielectric constant at the liquid nitrogen temperature. BY setting the composition as such, the substrate 401" shows the specific dielectric constant of 20,000–30,000 at 77° K. Thus, the transistor of the present invention is particularly suitable for combination with the high temperature superconductors that show the superconductivity at or above the liquid nitrogen temperature.

Figure 63:
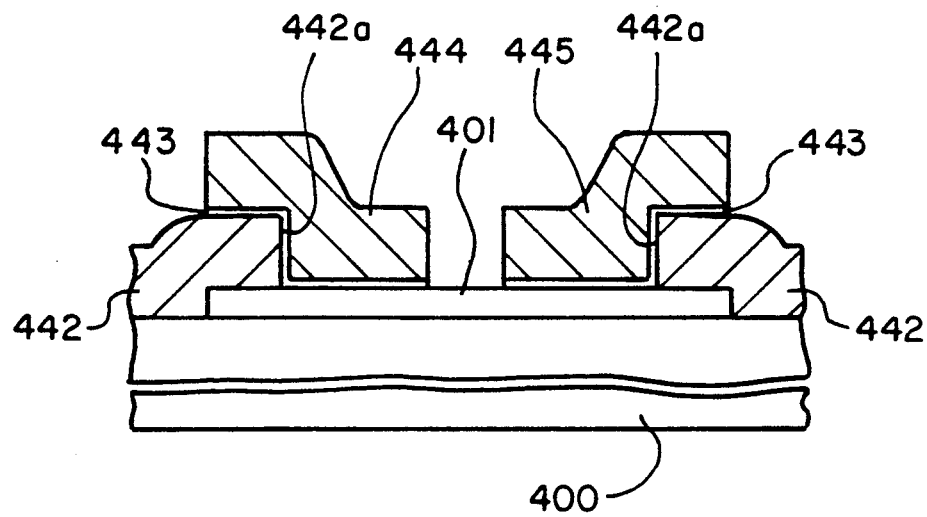
FIG. 63 is a diagram showing a transistor according to a sixteenth embodiment of the present invention.

FIG. 63 shows a tunnel transistor according to a sixteenth embodiment of the present invention.

In the present embodiment, an MgO substrate 400 is used, and the SrTiO$_3$ substrate 401 is provided on the upper major surface of the MgO substrate 400. The substrate 401 is divided into a plurality of isolated regions wherein only one such a region is shown in FIG. 63. The MgO substrate is covered by the silicon oxide layer 442 that also covers the substrate 401 underneath, and the layer 442 is provided with the cutout 442a similar to the foregoing embodiments such that the upper surface of the substrate 401 is exposed in correspondence to the cutout 442a. On the substrate 401, the barrier layer 443, the emitter region 444 and the collector region 445 are formed similar to the twelfth embodiment.

In the present embodiment, an excellent device isolation is achieved between the tunnel transistors that are formed commonly on the MgO substrate 400. Thus, the present embodiment is particularly suitable for constructing an integrated circuit of tunnel transistors.

Next, a tunnel transistor according to a seventeenth embodiment of the present invention will be described with reference to FIGS. 64–67.

Figure 64:
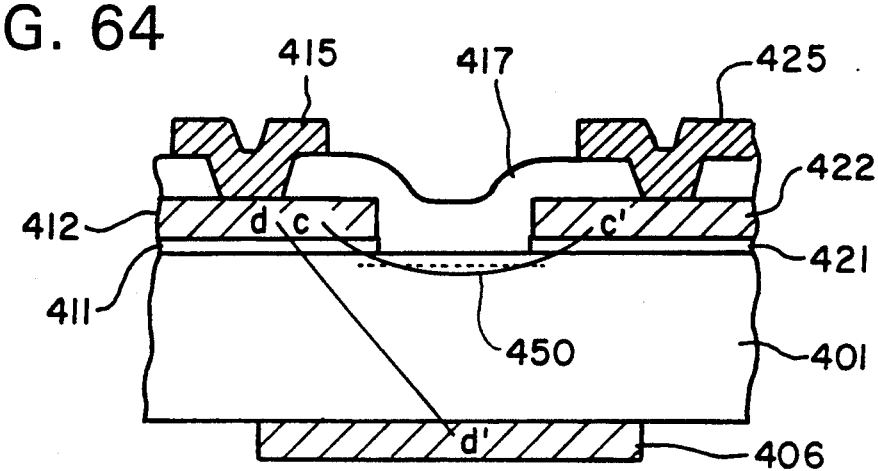
FIG. 64 is a diagram showing the transistor according to a seventeenth embodiment of the present invention.

The transistor of the present embodiment has a structure shown in FIG. 64 that is substantially identical with the structure of FIG. 47. In this structure, a resonant structure 450 having a resonant level is formed close to the upper major surface of the substrate 401 in correspondence to the channel region CH between the emitter region 412 and the collector region 422.

Figure 65:
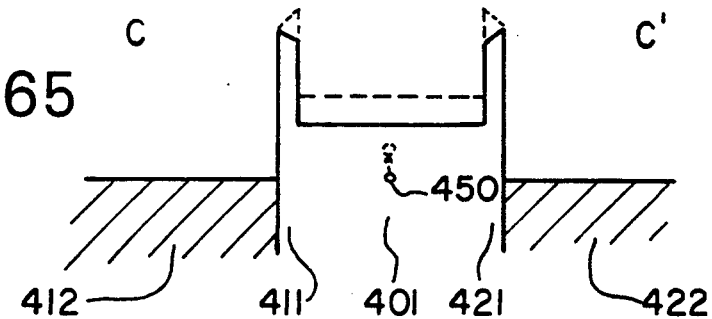
FIGS. 65-67 are band diagrams showing the band structure of the transistor of FIG. 64 for explanation of the operation.

FIG. 65 shows the band diagram of the transistor of FIG. 64 taken along a path c'—c'. As can be seen, the resonant level 450 is determined with respect to the lower edge of the conduction band of the SrTiO$_3$ substrate 401, and is shifted up and down when the energy level of the substrate 401 is shifted up and down in response to the control voltage applied to the control electrode 406.

Figure 66:
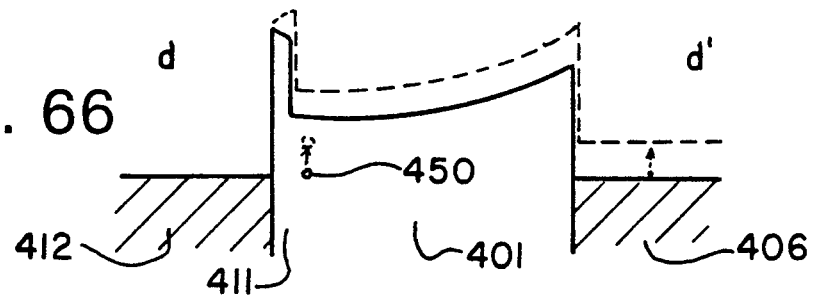

FIG. 66 shows the band diagram of the transistor along a path d—d' defined in FIG. 64. As already explained with reference to previous embodiments, the potential distribution in the substrate 401 is controlled in response to the control voltage applied to the control electrode 406, and therebythe energy level of the resonant level is shifted up and down as shown in FIG. 66.

Figure 67:
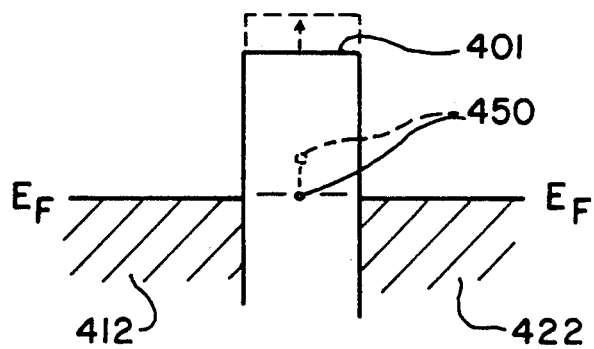

FIG. 67 shows the action of the resonant structure 450, wherein the open circle shows the case when the resonant level is not coincident to the energy level of the electrons supplied from the emitter region 412. In this case, the passage of the electrons through the barrier is controlled by the tunneling. On the other hand, when the resonant level coincides with the energy level of the electrons, the electrons can pass through the barrier in the substrate 401 along the resonant structure 450 with a significantly enhanced probability. By providing such a resonant structure, one can eliminate the passage of electrons that are thermally excited to the higher energy levels while selectively passing the electrons at the Fermi level in the emitter region 412. Thereby the thermal noise is eliminated in the transistor of the present embodiment and the operational environment of the transistor is not limited to the extremely low temperatures. Further, the transistor shows a large non-linear operational characteristics.

Figure 68:
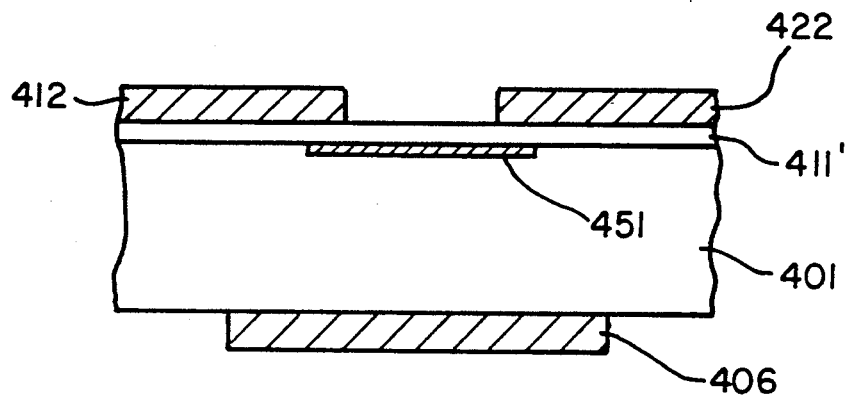
FIG. 68 is a diagram showing a transistor according to an eighteenth embodiment of the present invention.

FIG. 68 shows an eighteenth embodiment of the present invention, showing a modification of the resonant tunnel transistor of FIG. 64. In this embodiment, a single barrier layer 411' of silicon oxide having a thickness of about 2 nm, is used in place of the barrier layers 411 and 412. In this structure, a defect region 451 is formed at the upper major surface of the substrate 401 adjacent to the barrier layer 411', wherein the defect region 451 forms the oxygen defects that act as a deep impurity. As a result of the oxygen defects, the region 451 has a composition $SrTiO_{3-x}$. Such a defective region 451 may be formed for example by the electron or argon ion beam irradiation and the like.

Figure 69:
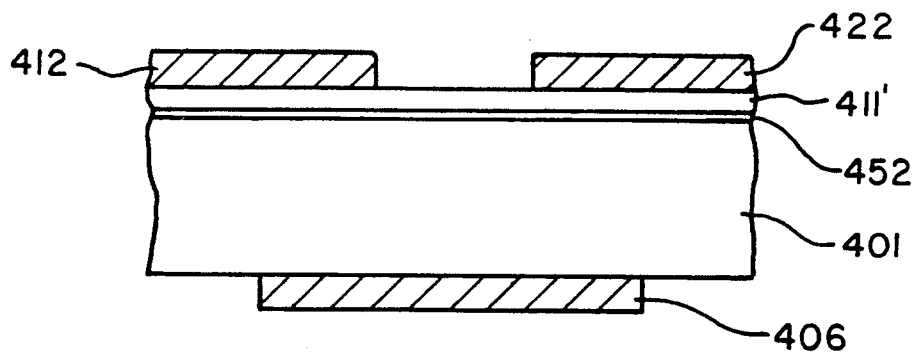
FIG. 69 is a diagram showing a transistor according to a nineteenth embodiment of the present invention.

FIG. 69 shows a nineteenth embodiment of the present invention, showing another modification of the transistor of FIG. 64. In this embodiment, the single barrier layer 411' of silicon oxide is used similarly to the embodiment of FIG. 68, and an amorphous silicon layer 452 is formed at the upper major surface of the $SrTiO_3$ substrate 401 adjacent to the barrier layer 411'. The amorphous silicon layer 452 has a thickness of about 1 nm and is formed without hydrogenation. Thereby, the layer 452 included a large number of resonant levels. Instead of using amorphous silicon, one may use other materials that contain a large number of impurity levels such as amorphous germanium, calcogenide glasses, and the like.

Figure 70:
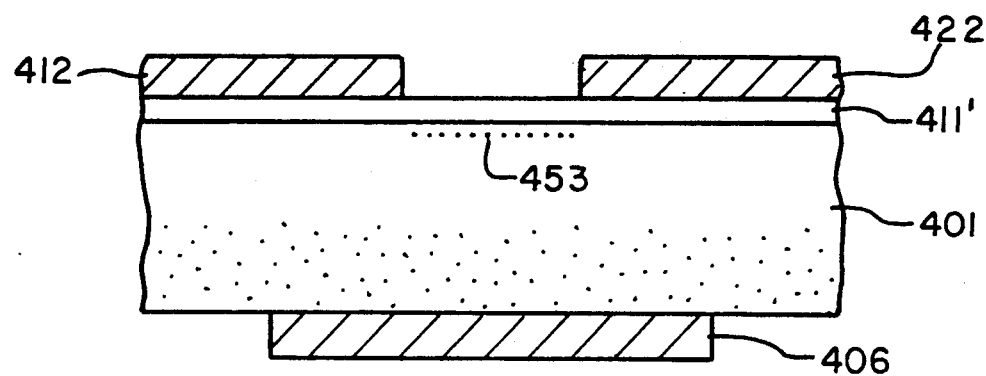
FIG. 70 is a diagram showing a transistor according to a twentieth embodiment of the present invention.

FIG. 70 shows a twentieth embodiment of the present invention, showing a modification of the transistor of FIG. 64. In this embodiment, the barrier layer 411' is used in place of the barrier layers 411 and 421, and the resonant structure 450 is formed as a region 453 wherein 0.001% of Ti atoms forming the $SrTiO_3$ substrate 401 is replaced by Nb atoms that act as deep donor. Alternatively, Ni atoms may be used in place of Nb atoms. In this case, the Ni atoms act as the deep acceptors.

Figure 71:
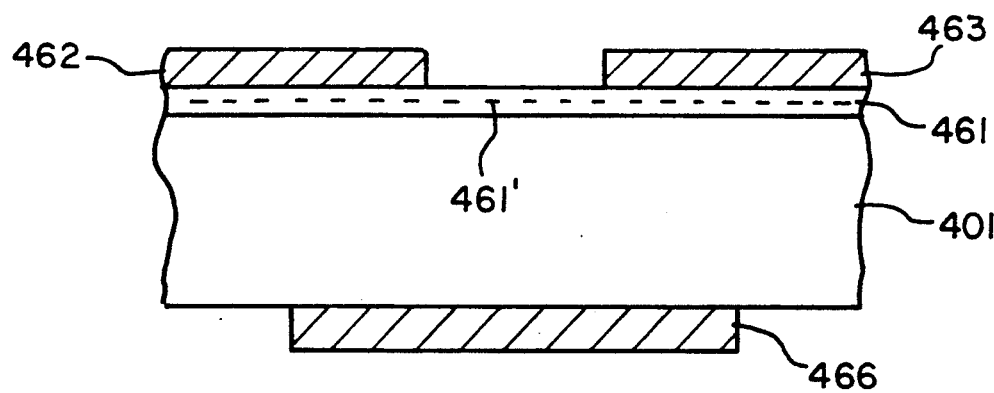
FIG. 71 is a diagram showing a transistor according to a twenty-first embodiment of the present invention.

FIG. 71 shows a twenty-first embodiment of the present invention, showing a modification of the transistor of FIG. 64. In this embodiment, a barrier layer 461 of $PrBa_2Cu_3O_x$ is deposited on the upper surface of the $SrTiO_3$ substrate 401 with a thickness of 1.2 nm instead of the barrier layers 411 and 412. Further, an emitter region 462 and a collector region 463 both of $YBa_2Cu_3O_x$ are formed on the barrier layer 461. Further, a control electrode 466 of $YBa_2Cu_3O_x$ is provided on the lower surface of the substrate 401. In this structure, the naturally existing impurity levels 461' in the barrier layer 461 are used for the transfer of the carriers.

Figure 72:
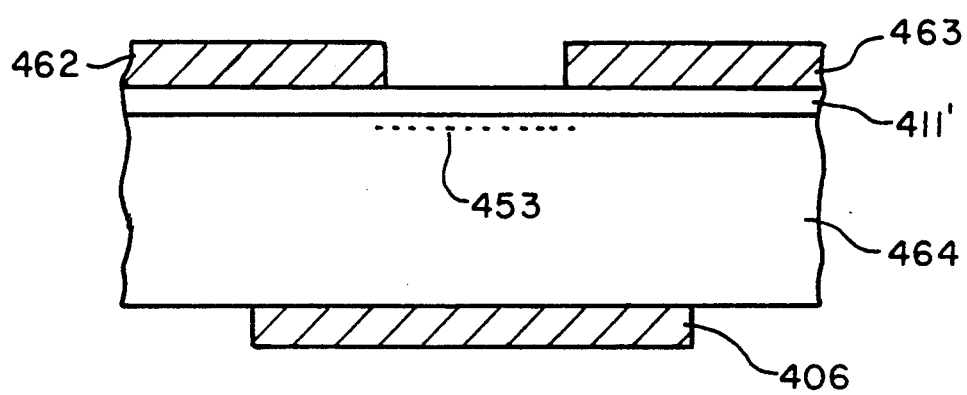
FIG. 72 is a diagram showing a transistor according to a twenty-second embodiment of the present invention.

FIG. 72 shows a twenty-second embodiment of the present invention, showing a modification of the transistor of FIG. 64. In this embodiment, a substrate 464 of $KTa_{1-x}Nb_xO_3$ is employed in place of the $SrTiO_3$ substrate 401, similarly to the case of the embodiment Of FIG. 62. The compositional parameter x is controlled depending on the operational temperature at which the device is to be used such that the substrate 464 has the maximum dielectric constant at the operational temperature. For example, a specific dielectric constant of a few ten thousands is achieved at the liquid helium temperature by setting the parameter x as x=0.05. The resonant structure is formed as a structure 453, wherein the structure 453 is formed by the oxygen defects similarly to the case of the embodiment of FIG. 68.

Figure 73:
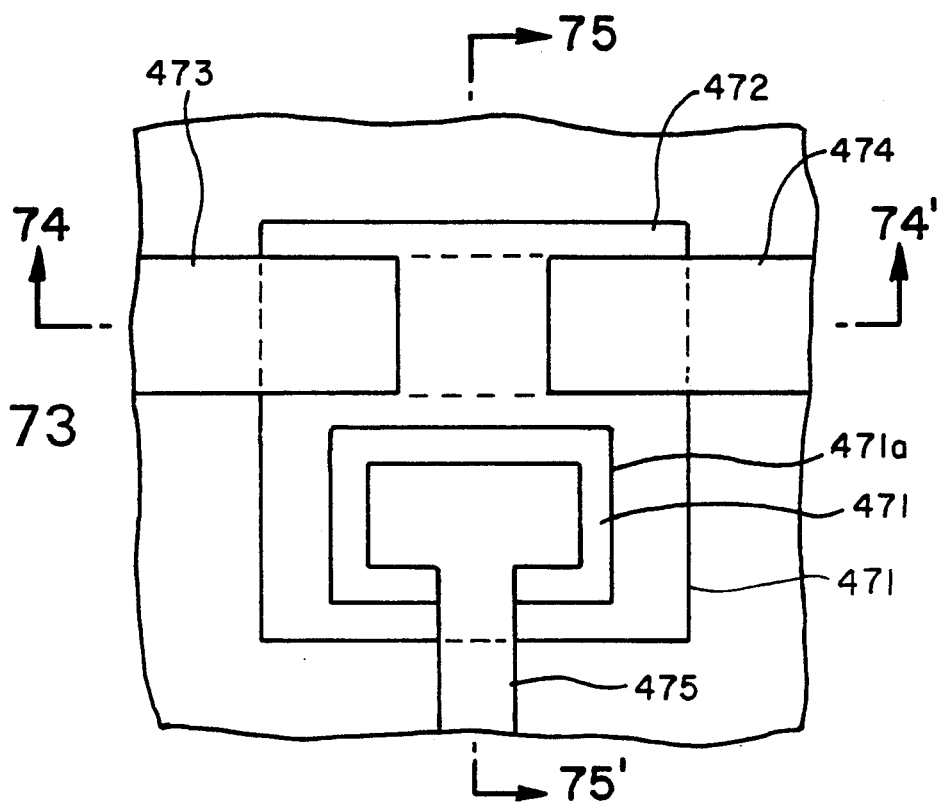
FIGS. 73-75 are diagrams showing a transistor according to a twenty-third embodiment of the present invention.
Figure 74:
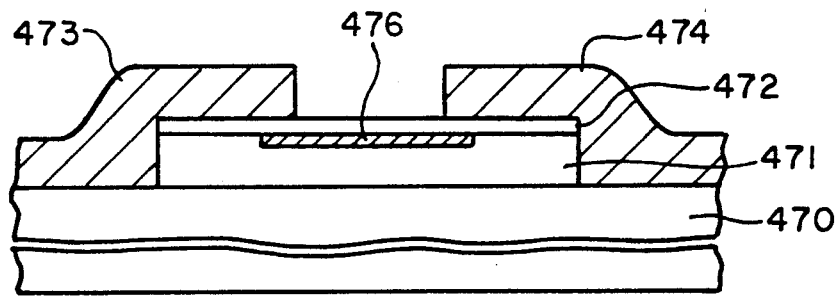
Figure 75:
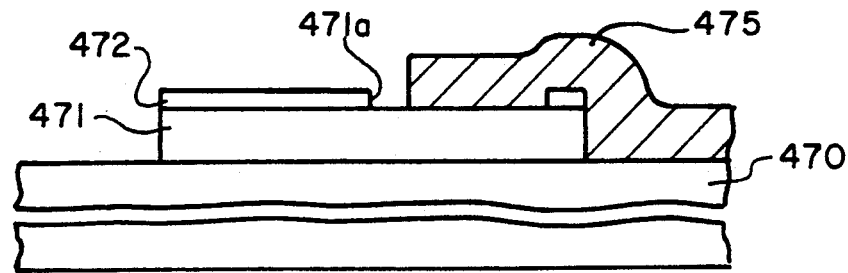

FIGS. 73-75 show a tunnel transistor according to a twenty-third embodiment of the present invention. In the present embodiment, an MgO substrate 470 is used and the $SrTiO_3$ substrate 471 is provided on the upper major surface of the substrate 470 similar to the embodiment of FIG. 63. On the substrate 470, a silicon oxide barrier layer 472 is formed with a thickness of 2 nm except for a region 471a where the control electrode is to be formed. Further, a pair of opposing emitter and collector regions 473 and 474 of tantalum are provided on the upper major surface of the barrier layer 472 to extend from both sides, leaving the channel region CH therebetween. Further, a control electrode 475 of tantalum is provided directly on the substrate 471 in correspondence to the exposed part 471a thereof.

In this transistor, the resonant structure 450 is formed as the defect region 476 formed in correspondence to the channel region CH as shown in FIG. 74 showing the cross section taken along the line 74—74' of FIG. 73 such that the defect region 476 includes the oxygen defects. Thus, the region 476 has the composition $SrTiO_{3-x}$ similar to the embodiment of FIG. 68. Such a region can be formed by the irradiation of ion beam as already described.

FIG. 75 shows the transistor of FIG. 73 taken along the line 75—75'. This drawing shows that the control electrode 475 making the contact with the upper major surface of the substrate 471 at the exposed region 471a. As the action of the control electrode is identical with other embodiments, further description will be omitted.

In the foregoing first through twenty-third embodiments, it should be noted that the device operates similarly when the holes are used for the carriers. In the example of FIG. 13, for example, the holes that have injected by the emitter region 101 and tunneled through the dielectric layer 103 reaches the collector region 102 along the valence band of the dielectric layers 104 and 105 while being controlled by the control voltage applied to the control electrode 108. The operation for other embodiments for the case of using holes for the carriers is obvious from the foregoing description and further description will be omitted.

Next, a twenty-fourth embodiment of the present invention will be described with reference to FIG. 76. The electron device of the present invention works as a diode.

Figure 76:
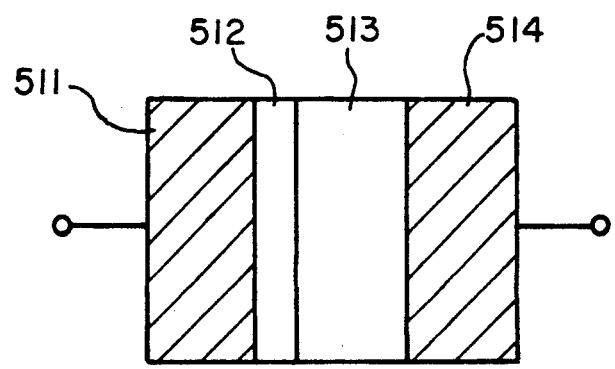
FIG. 76 is a diagram showing a diode according to a twenty-fourth embodiment of the present invention.

Referring to FIG. 76, the diode of the present invention has a layered structure comprising a cathode electrode 511, a first thin dielectric layer 512 formed on the cathode electrode 511, a second dielectric layer 513 having a large dielectric constant provided on the first dielectric layer 512, and an anode electrode 514 provided on the second dielectric layer 513. The first dielectric layer 512 may comprise silicon oxide having a small dielectric constant $\epsilon_1$ and has a thickness to allow the tunneling of the electrons. On the other hand, the second dielectric layer 513 is a doped dielectric layer and may comprise $SrTiO_3$ that has a very large dielectric constant $\epsilon_2$. As already described, the doping of the $SrTiO_3$ is achieved by replacing some of the St atoms by Nb atoms. In this structure, the tunneling of electrons occurs, when biased appropriately, such that the electrons from the cathode layer 511 tunnel through the dielectric layer 512 and reach the anode layer 514, moving along the conduction band of the dielectric layer 513.

Figure 77:
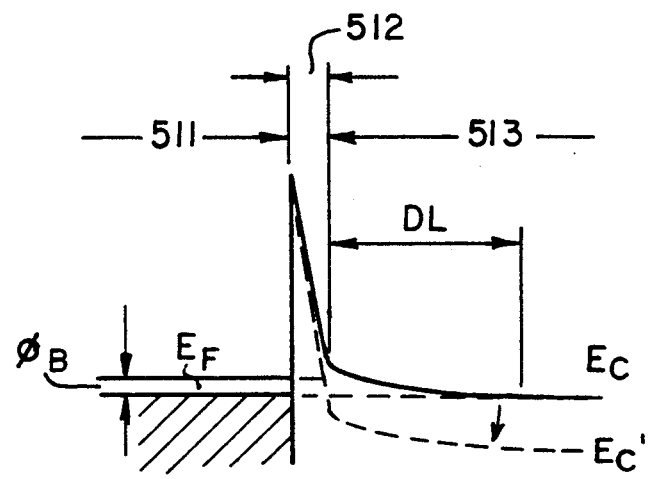
FIG. 77 is a band diagram showing the operation of the diode of FIG. 76.

FIG. 77 shows the band diagram of the structure of FIG. 76 wherein the solid line represents the thermal equilibrium state and the broken line represents the case where a forward bias is applied. In this structure, it can be seen, from this band diagram, that almost all the voltage applied to the diode appears across the barrier layer 512 because the continuity of electric displacement that makes the electric field in the depletion layer much lower than in the barrier layer. From the same reason, almost all the bending of band occurs in the barrier layer 512. As a result, the bending of band in the second dielectric layer 513 in correspondence to the depletion region DL formed therein is substantially reduced.

Figure 78:
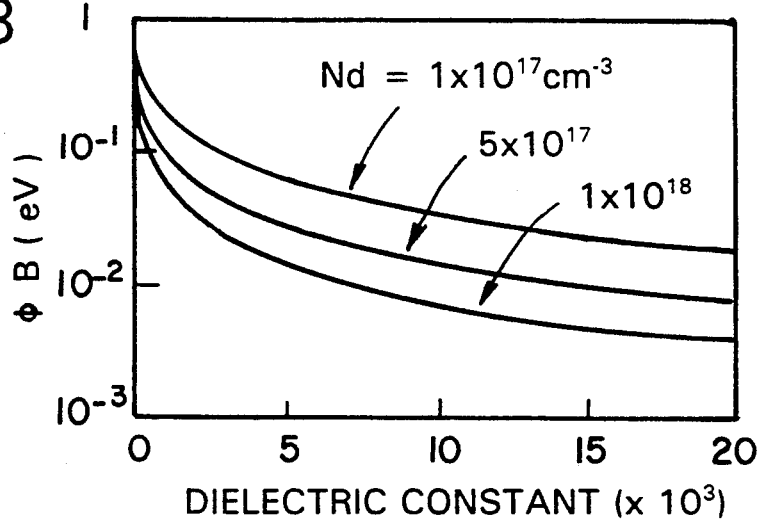
FIG. 78 is a diagram showing the effective barrier height as a function f the dielectric constant of the dielectric layer.

In the structure of FIG. 76, it should be noted that the effective barrier height against the electrons that tunnel through the layer 512 from the cathode electrode 511 to the dielectric layer 513 and transported further to the anode layer 514 along the conduction band of the layer 513, is given by the height $\phi_B$ of the conduction band edge at the interface between the first dielectric layer 512 and the second dielectric layer 513. FIG. 78 shows the calculation of the value of $\phi_B$ against the dielectric constant $\epsilon_2$ of the layer 513, using the depletion approximation. In this calculation, the layer thickness of the first dielectric layer 512 is assumed to be 60 Å, the dielectric constant $\epsilon_1$ of the layer 512 of 10. The calculation is made for various dopant levels Nd of the n-type dopant.

According to this calculation, it is predicted that the barrier height $\phi_B$ under the zero-bias condition can be reduced to several millivolts, when the dielectric constant $\epsilon_2$ of the layer 513 is set to about $10^4$, the carrier concentration in the layer 513 set to $10^{17}$–$10^{18}$ cm$^{-3}$, and the sum of the band bending in the layers 512 and 513 of 1 eV.

When a voltage is applied to the diode, the band in the layer 513 shows a parallel shift. This is because most of the band bending occurs in the first dielectric layer 512. When the applied voltage is positive on the layer 513, the level of conduction band of the layer 513 is shifted in the downward direction with respect to the Fermi level $E_F$ and the current passing from the cathode layer 511 to the anode layer 514 increases. On the other hand, when a negative voltage is applied, the conduction band of the layer 513 shifts upward and the current flowing through the diode disappears substantially. It should be noted that, because of the effective barrier height $\phi_B$ of a few millivolts in the unbiased state, the diode can successfully rectify the small voltage signals of which voltage swing may be a few millivolts.

In the present invention, the thickness of the layer 512 may be chosen to allow the tunneling of electrons in the unbiased state. Alternatively, the thickness of the layer 512 may be chosen slightly larger such than the tunneling occurs only when the diode is forward-biased as shown by the broken line in FIG. 77.

Figure 79:
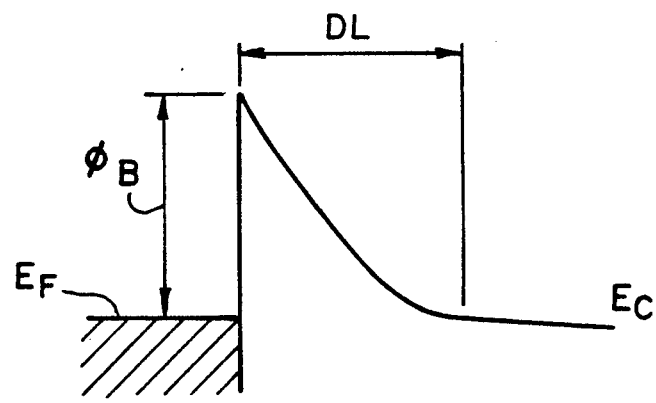

FIG. 79 shows the conventional Schottky barrier formed at a metal-semiconductor junction. In this case, the effective barrier height $\phi_B$ is determined by the band bending forming the depletion region DL at the junction, and this value is determined by the combination of the materials forming the junction. Generally, the value of $\phi_B$ cannot be reduced below 0.5–0.8 volts. Because of this, the conventional diodes have suffered from the problem that it shows a threshold characteristic of 0.5–0.8 volts and cannot rectify the signals having the voltage swing smaller than the threshold. The diode of the present invention successfully eliminates this problem and is extremely useful for the telecommunication systems and radar systems.

The current-voltage characteristics of the diode of FIG. 76 is given by the following equation.

$$I = SA^*T^2\exp(-\phi_B/kT)\{\exp(qV/n'kT) - \exp[(1/n' - 1) \cdot qV/kT]\}$$
$$= -SA^*T^2\exp(-\phi_B/kT)\{\exp(qV/nkT) - \exp[(1/n - 1) \cdot qV/kT]\}$$

where S represents the diode area, A* represents the effective Richardson constant including the effect of electron tunneling probability through the layer 512, $\phi_B$ is the effective barrier height, T the temperature, V' ($= -V$) the electrode voltage of the cathode layer 511 with respect to the voltage of the layer 513, n' the ideality factor for the forward bias condition, and n the ideality factor for the backward operation given by $n^{-1} = 1 - n'^{-1}$. The value of n' is given by $$1/n' = 1 - \phi_B/(qV')$$
$$= 1 - [1 + (2\epsilon_0\epsilon_2/(q^2N_d))(\epsilon_1/(\epsilon_2 d)^2(\phi_{BO} - kT)]^{-\frac{1}{2}}$$

where $N_d$ represents the semiconductor carrier density, $\phi_{BO}$ the zero bias barrier height in the absence of the tunneling barrier, $\epsilon_2$ the dielectric constant of the layer 513, and $\epsilon_1$ represents the dielectric constant of the layer 512.

Figure 80:
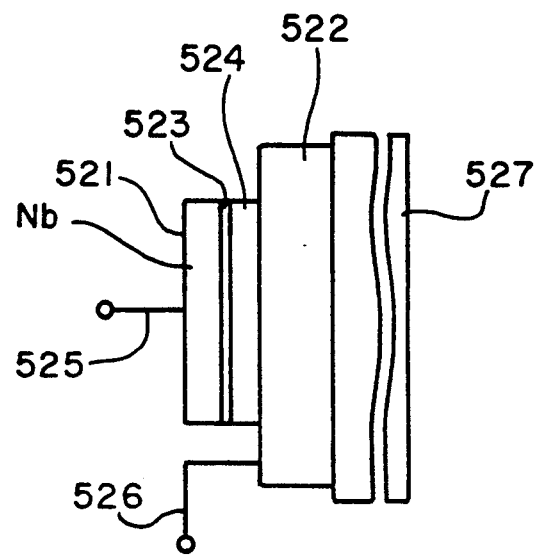
FIG. 80 is a diagram showing the diode according to a twenty-fifth embodiment of the present invention.

FIG. 80 shows a twenty-fifth embodiment of the present invention showing a modification of the diode of FIG. 76. The diode comprises a substrate 527 of silicon on which a platinum layer 522 is formed as the anode electrode. A lead 526 is connected to the layer 522. On the anode layer 522, a dielectric layer 524 of SrTiO$_3$ is provided with the thickness of 1000 Å, and a silicon layer 523 is provided on the dielectric layer 524 with a thickness of 60 Å. Thereby, the dielectric layer 524 corresponds to the dielectric layer 513 and the dielectric layer 523 corresponds to the dielectric layer 512. Further, a Nb layer 521 is formed on the silicon layer 523 as the cathode layer 511. Further, a lead 525 is connected to the cathode layer 521.

In the diode of the present embodiment, the conductance is increased 15 times as compared to the zero-bias conductance when a forward voltage of 10 mV is applied. Further, when a forward voltage of 20 mV is applied, the conductance is increased by 60 times. Thus, the diode has an excellent rectification characteristic.

Figure 81:
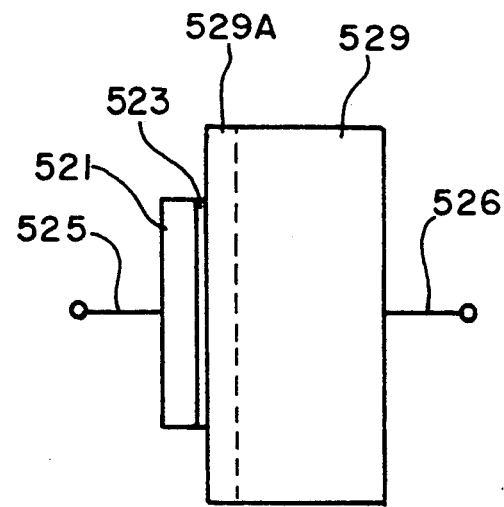
FIG. 81 is a diagram showing the diode according to a twenty-sixth embodiment of the present invention.

FIG. 81 shows a twenty-sixth embodiment of the present invention, showing a modification of the diode of FIG. 76. In this embodiment, a SrTiO$_3$ substrate 529 is used wherein Nb is doped with the carrier concentration level of $6 \times 10^{17}$ cm$^{-3}$, for example. The substrate is formed with the thickness of 400 μm and is doped to the n-type. Because of the conductivity of the substrate 529, the lead 526 is connected directly to the substrate 529. On the surface opposite to the side to which the lead 526 is connected, a surface depletion region 529A is formed. On the substrate 529, the dielectric layer 523 and the cathode layer 521 are provided similarly to the previous embodiment, and the lead 525 is connected to the cathode layer 521. In this embodiment, the fabrication of the device is facilitated because of the direct connection of the lead 526 to the substrate 529.

Figure 82:
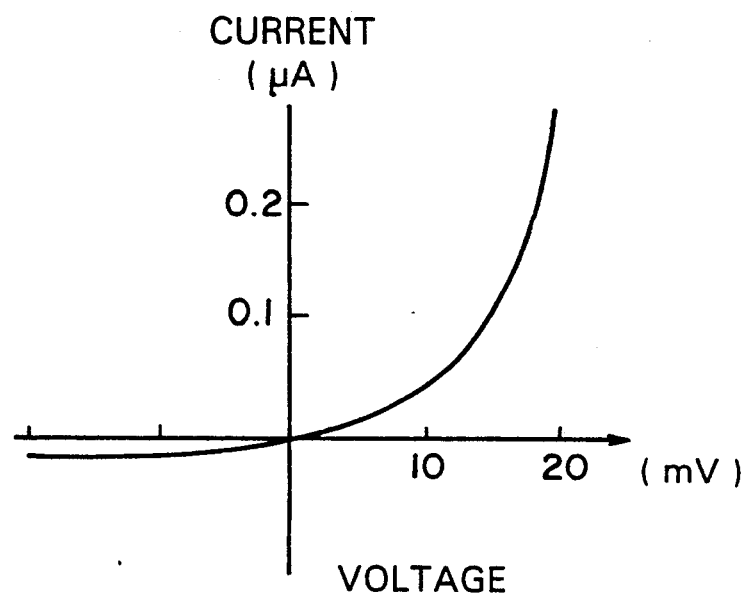
FIG. 82 is a graph showing the voltage-current relationship for the diode of FIG. 76.

FIG. 82 shows the voltage-current characteristics of the diode of the present embodiment. This characteristic is obtained at the liquid helium temperature. As can be seen, a clear rectification is obtained for the voltage signal of which voltage swing is only 20 mV.

Figure 83:
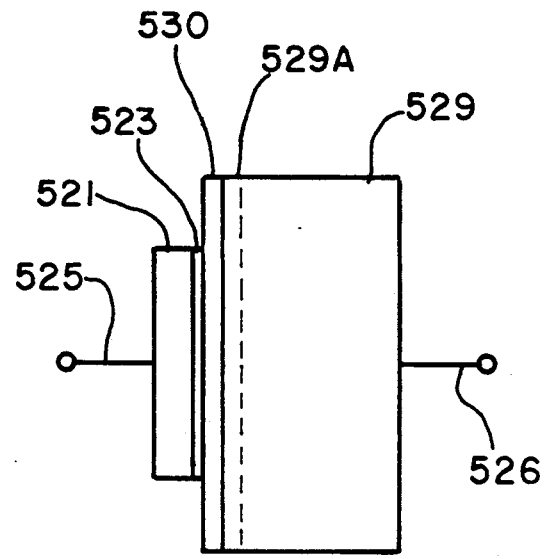
FIG. 83 is a diagram showing the structure of the diode according to a twenty-seventh embodiment of the present invention.

FIGS. 83 shows a twenty-seventh embodiment of the present invention, wherein an undoped SrTiO$_3$ layer 530 is provided on the surface of the substrate 529 where the surface depletion region 529A is formed. The layer 530 has a thickness of about 500 Å and blocks the carriers that penetrate through the depletion region 529A. By constructing the diode as such, one can reduce the leak current in the reverse direction.

Figure 84:
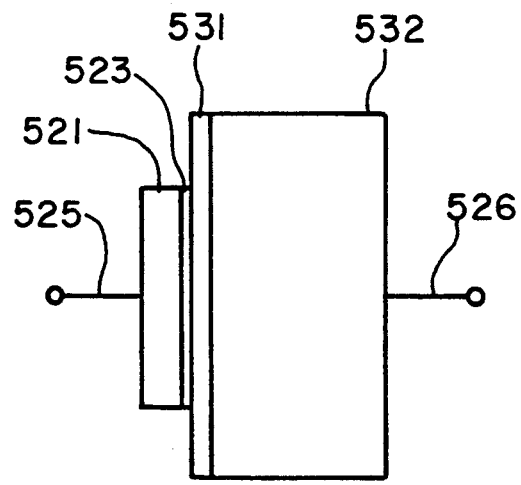
FIG. 84 is a diagram showing the structure of the diode according to a twenty-eighth embodiment of the present invention.

FIG. 84 shows a twenty-eighth embodiment of the present invention, wherein a substrate 532 of $KTa_{1-x}Nb_xO_3$ is used instead of the substrate 529. The substrate is doped to the n-type and has the compositional parameter x set to 0.05. The doping of the substrate 532 may be achieved by substituting the K atoms by Ca atoms. On the substrate 532, an undoped layer 531 of the same composition is provided. Further, the silicon barrier layer 523 and the cathode layer 521 are provided consecutively on the surface of the layer 531. By choosing the composition of the substrate as such, a maximum dielectric constant is realized at 77° K corresponding to the liquid nitrogen temperature. Thereby, the diode of the present embodiment shows the excellent performance at the liquid nitrogen temperature.

Figure 85:
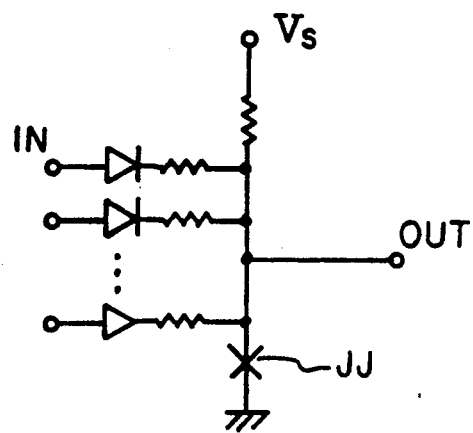
FIG. 85 is a circuit diagram showing a Josephson AND gate formed by the diode of the present invention.

FIG. 85 shows the example of use of the diode of the present invention. In this example, the diode is used in combination with a Josephson junction JJ to form an OR gate. It should be noted that the logic signals handled by such Josephson circuits generally have the logic amplitude of only a few millivolts and conventional diodes could not be used for constructing the OR gate as shown. As a result of this, the conventional Josephson OR gates have used an extremely complex construction including superconducting quantum interferometer. With the use of the diode of the present invention, the construction of the Josephson OR gate is substantially simplified.

Figure 86:
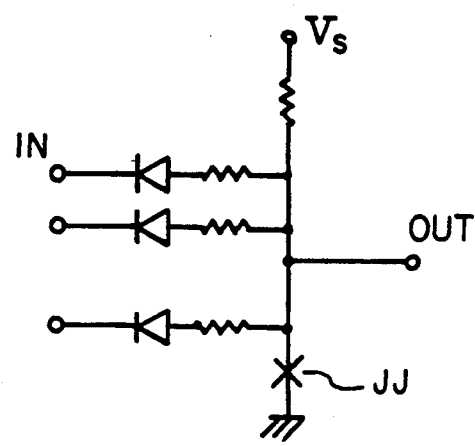
FIG. 86 is a circuit diagram showing a Josephson OR gate formed by the diode of the present invention.

FIG. 86 shows the example of a Josephson AND gate wherein the diode of the present invention is used. In this embodiment, too, the circuit construction is significantly simplified.

Figure 87:
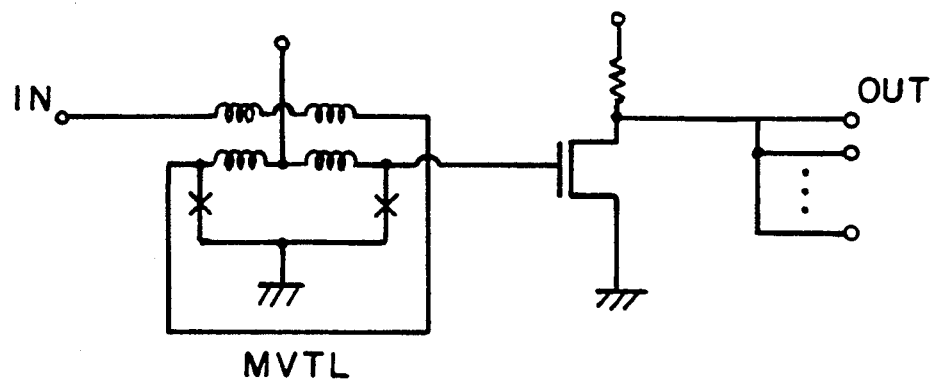
FIG. 87 is a circuit diagram showing the use of the transistor of the present invention for processing the output of a Josephson logic circuit.

FIG. 87 shows an example of use of the transistor of the present invention. In this embodiment, the transistor is used for receiving the output of a Josephson logic gate such as the MVTL gate and amplified the same. Thereby, a large number of fan-out can be obtained easily.

Further, the present invention is by no means limited to the embodiments described heretofore, but various variations and modifications maY be made without departing from the scope of the invention.

INDUSTRIAL APPLICABILITY

As described heretofore, the electron device of the present invention provides a transistor having a high voltage and current gain when embodied as a transistor, because of the elimination of the leak current flowing through the dielectric layer. Such a transistor shows a high operational speed that is not limited by the base resistance. Further, the punch through phenomenon is eliminated. By using the resonant structure in the dielectric layer, the transistor shows a non-linear characteristic. Such a transistor operates in the wide temperature range. Further, various conductor materials including the superconductors and high-temperature superconductors may be used for the emitter and collectors. Thereby, the speed of the transistor is further improved. Further, the present invention provides a diode wherein the forward threshold voltage is substantially eliminated. In other words, the diode of the present invention is capable of processing extremely feeble signals of which voltage swing maY be several millivolts or less.

I claim:

1. An electron device, comprising:
 a first dielectric layer having an upper major surface and an opposing lower major surface, said first dielectric layer having a first thickness determined to allow the tunneling of carriers therethrough and a first dielectric constant, said first dielectric layer acting as a tunneling barrier;
 a second dielectric layer having an upper major surface in direct contact with the lower major surface of the first dielectric layer and an opposing lower major surface, said second dielectric layer having a second thickness substantially larger than the first thickness and a second dielectric constant that is substantially larger than the first dielectric constant;
 first electrode means provided on the upper major surface of the first dielectric layer for injecting the carriers into the first dielectric layer; and
 second electrode means provided in contact with the second dielectric layer, said second electrode means being applied with a control voltage for controlling a flow of the carriers through the second dielectric layer.

2. An electron device as claimed in claim 1 in which said second dielectric layer has a conduction band and a valence band, and said second dielectric constant is chosen such that a potential level of the conduction band and the valence band is controlled in response to the control voltage by the electrostatic induction effect.

3. An electron device as claimed in claim 1 in which said second dielectric constant is at least larger than 2000.

4. An electron device as claimed in claim 3 in which said second dielectric constant is at least larger than 20,000.

5. An electron device as claimed in claim 1 in which said second dielectric layer comprises an oxide containing one or more of titanium, tin, zirconium, niobium and tantalum.

6. An electron device as claimed in claim 1 in which said second dielectric layer is selected from a group consisted of strontium titanate, barium titanate, calcium stannate, barium stannate, barium zirconate, lithium niobate, lithium tantalate and a mixture thereof.

7. An electron device as claimed in claim 1 in which said second dielectric layer comprises strontium titanate.

8. An electron device as claimed in claim 1 in which said second dielectric layer comprises potassium tantalum niobate having a composition of $KTa_{1-x}Nb_xO_3$ with the parameter x set to about 0.005.

9. An electron device as claimed in claim 1 in which said first thickness is about 10 nm.

10. An electron device as claimed in claim 1 in which said first dielectric layer comprises silicon.

11. An electron device as claimed in claim 1 in which said first dielectric layer comprises silicon oxide.

12. An electron device as claimed in claim 1 in which said second dielectric layer is doped with impurities to form a carrier density therein, wherein said second electrode means is provided on the lower major surface of the second dielectric layer for collecting the carriers injected at the first electrode means and passed through the first and second dielectric layers.

13. An electron device as claimed in claim 12 in which said second dielectric layer is formed with a depletion region at the upper major surface thereof in contact with the first dielectric layer, said depletion region forming an effective barrier height against the carriers from the first electrode means of several millivolts in the thermal equilibrium state.

14. An electron device as claimed in claim 13 in which said second dielectric layer is doped with a carrier concentration level of $10^{17}$–$10^{18}$ cm$^{-3}$.

15. An electron device as claimed in claim 12 in which said second dielectric layer comprises a first stratum along the upper major surface thereof and a second stratum adjacent to the first stratum, the second stratum having an impurity concentration higher than the first stratum.

16. An electron device as claimed in claim 12 in which at least one of said first and second electrode means comprises a superconductor.

17. An electron device as claimed in claim 1 in which said electron device further comprises third electrode means separated from the first and second electrode means for collecting the carriers injected at the first electrode means and traveled through the first and second dielectric layers.

18. An electron device as claimed in claim 17 in which said second dielectric layer has a side wall laterally surrounding the second dielectric layer, said second electrode means is provided on the side wall of the second dielectric layer, and said third electrode means is provided to collect the carriers via the lower major surface of the second dielectric layer.

19. An electron device as claimed in claim 18 in which said electron device further comprises a third dielectric layer having a third dielectric constant substantially smaller than the second dielectric constant, said third dielectric layer having an upper major surface and a lower major surface and provided such that the upper major surface thereof makes a direct contact with the lower major surface of the second dielectric layer.

20. An electron device as claimed in claim 19 in which said third dielectric layer comprises a semiconductor material having a band gap substantially smaller than that of the second dielectric layer.

21. An electron device as claimed in claim 20 in which said third dielectric layer comprises zinc oxide.

22. An electron device as claimed in claim 18 in which said second electrode means is connected to the side wall of the second dielectric layer at two, laterally opposing locations separated from each other by a distance of 2 μm or less.

23. An electron device as claimed in claim 17 in which at least one of said first and second electrode means comprises a superconductor.

24. An electron device as claimed in claim 23 in which said second dielectric layer comprises potassium tantalum niobate represented as $KTa_{1-x}Nb_xO_3$, and at least one of the first and second electrode means comprises a high temperature superconducting oxide.

25. An electron device as claimed in claim 23 in which said electron device further comprises a third dielectric layer in an intimate contact relationship with one of said upper and lower major surfaces of said second dielectric layer, said third dielectric layer carrying said third electrode means, said first and third electrode means comprise $YBa_2Cu_3O_7$, and said first and third dielectric layers comprise a low dielectric compound that contains elements that are commonly contained in the first and third electrode means.

26. An electron device as claimed in claim 25 in which said first and third dielectric layers comprise $PrBa_2Cu_3O_7$.

27. An electron device as claimed in claim 23 in which said electron device further comprises a third dielectric layer in an intimate contact relationship with said upper major surface of said second dielectric layer, said third dielectric layer carrying third electrode means, said first and third electrode means comprising $YBa_2Cu_3O_x$, said first and third dielectric layers comprising a low dielectric compound that contains elements that are commonly contained in the first and third electrode means, said first and third dielectric layers being a single layer.

28. An electron device as claimed in claim 27 in which said first and third dielectric layers comprise $PrBa_2Cu_3O_x$.

29. An electron device as claimed in claim 17 in which said first dielectric layer includes therein a region of discrete energy level for causing a resonant tunneling of the carriers therethrough.

30. An electron device as claimed in claim 17 in which said first dielectric layer is formed to expose the upper major surface of the second dielectric layer, and said second electrode means is connected to the exposed upper major surface of the second dielectric layer directly.

31. An electron device as claimed in claim 17 in which said first dielectric layer is provided on a part of the upper major surface of the second dielectric layer, leaving the rest of the upper major surface of the second dielectric layer exposed, said third electrode means being provided on the upper major surface of the second dielectric layer.

32. An electron device as claimed in claim 31 in which said third electrode means is provided to surround the first electrode means on the upper major surface of the second dielectric layer.

33. An electron device as claimed in claim 31 in which said second electrode means is provided on the lower major surface of the second dielectric layer.

34. An electron device as claimed in claim 31 which said second electrode means is provided on the upper major surface of the second dielectric layer.

35. An electron device as claimed in claim 31 in which a third dielectric layer having a thickness to allow the tunneling of carriers is provided between the upper major surface of the second dielectric layer and the third electrode means.

36. An electron device as claimed in claim 31 in which said third electrode means is provided on the upper major surface of the second dielectric layer via the first dielectric layer intervening therebetween.

37. An electron device as claimed in claim 31 in which a resonant structure having a predetermined, discrete energy level is formed in the second dielectric layer along the upper major surface in correspondence to a region between the first electrode means and the second electrode means.

38. An electron device as claimed in claim 37 in which said resonant structure comprises a region involving defects.

39. An electron device as claimed in claim 37 in which said resonant structure comprises a region of amorphous silicon.

40. A transistor, comprising:
 a first electrode for injecting carriers, said first electrode having an upper major surface and a lower major surface;
 a first dielectric layer having an upper major surface and a lower major surface and provided on the upper major surface of the first electrode such that the lower major surface of the first dielectric layer makes a direct contact with the upper major surface of the first electrode, said first dielectric layer having a first dielectric constant;

a second dielectric layer having an upper major surface and a lower major surface and provided on the upper major surface of the first dielectric layer such that the lower major surface of the second dielectric layer makes a direct contact with the upper major surface of the first dielectric layer, said second dielectric layer having a dielectric constant substantially larger than the first dielectric constant;

a second electrode connected to the second dielectric layer for applying a control voltage controlling a potential level of the conduction band and the valence band of the second dielectric layer;

a third dielectric layer having an upper major surface and a lower major surface and provided on the upper major surface of the second dielectric layer with the lower major surface of the third dielectric layer making a direct contact with the upper major surface of the second dielectric layer, said third dielectric layer having a third dielectric constant substantially smaller than the second dielectric constant; and a third electrode having an upper major surface and a lower major surface and provided on the upper major surface of the third dielectric layer for collecting the carriers;

said second electrode being applied with the control voltage and controlling the flow of the carriers traveling from the first electrode to the third electrode, passing through the first, second and third dielectric layers, by controlling the potential level in the second dielectric layer.

* * * * *

UNITED STATES PATENT AND TRADEMARK OFFICE
CERTIFICATE OF CORRECTION

PATENT NO. : 5,291,274
DATED : March 1, 1994
INVENTOR(S) : Tamura

It is certified that error appears in the above-indentified patent and that said Letters Patent is hereby corrected as shown below:

Col. 3, line 68, "wit" should be --with--.

Col. 9, line 62, "78" should be --79--.

line 22, "level" should be --level.--.

Col. 12, line 39, (equation), "$d_1 2d_3+$" should be --$d_1 d_2 d_3+$--.

Col. 13, line 21, delete "a" (second occurrence);

line 59, "side" should be --sides--.

Col. 15, line 6, "in stead" should be --instead--.

Col. 16, line 8, "over" should be --other--;

Col. 17, line 33, "combination" should be --combinations--.

Col. 19, line 61, "Combination" should be --combination--.

UNITED STATES PATENT AND TRADEMARK OFFICE
CERTIFICATE OF CORRECTION

PATENT NO. : 5,291,274

DATED : March 1, 1994

INVENTOR(S) : Tamura

It is certified that error appears in the above-indentified patent and that said Letters Patent is hereby corrected as shown below:

Col. 20, line 34, "vide" should be --vided--;

line 47, "con conduction" should be --conduction--.

Col. 21, line 35, "Provided" should be --provided--.

Col. 22, line 52, "though" should be --through--.

Col. 23, line 56, "BY" should be --By--.

Col. 25, line 45, "Of" should be --of--.

Col. 26, line 63, "From" should be --For--.

Col. 27, line 42, "than" should be --that--.

Col. 29, lines 41 and 63, "maY" should be --may--.

UNITED STATES PATENT AND TRADEMARK OFFICE
CERTIFICATE OF CORRECTION

PATENT NO. : 5,291,274

DATED : March 1, 1994

INVENTOR(S) : Tamura

It is certified that error appears in the above-indentified patent and that said Letters Patent is hereby corrected as shown below:

Col. 32, line 2, after "carrying" insert --said--;

line 36, after "31" insert --in--.

Signed and Sealed this

Twenty-fifth Day of October, 1994

Attest:

BRUCE LEHMAN

Attesting Officer     *Commissioner of Patents and Trademarks*